United States Patent
Wagman et al.

(10) Patent No.: US 10,263,353 B2
(45) Date of Patent: Apr. 16, 2019

(54) PRECIOUS-METAL-ALLOY CONTACTS

(71) Applicant: Apple Inc., Cupertino, CA (US)

(72) Inventors: Daniel C. Wagman, Los Gatos, CA (US); Benjamin J. Kallman, Menlo Park, CA (US); Hani Esmaeili, Sunnyvale, CA (US); Stefan A. Kowalski, San Jose, CA (US); Daniel T. McDonald, Cupertino, CA (US); Eric S. Jol, San Jose, CA (US); Raymund W. M. Kwok, Hong Kong (HK)

(73) Assignee: Apple Inc., Cupertino, CA (US)

( * ) Notice: Subject to any disclaimer, the term of this patent is extended or adjusted under 35 U.S.C. 154(b) by 9 days.

(21) Appl. No.: 15/464,051

(22) Filed: Mar. 20, 2017

(65) Prior Publication Data
US 2017/0271800 A1 Sep. 21, 2017

Related U.S. Application Data

(60) Provisional application No. 62/310,445, filed on Mar. 18, 2016, provisional application No. 62/383,381, (Continued)

(51) Int. Cl.
*H01R 13/02* (2006.01)
*H01R 13/03* (2006.01)
(Continued)

(52) U.S. Cl.
CPC ............ *H01R 13/03* (2013.01); *B32B 15/00* (2013.01); *C22C 5/00* (2013.01); *C22C 5/02* (2013.01);
(Continued)

(58) Field of Classification Search
CPC ..................................................... H01R 13/03
See application file for complete search history.

(56) References Cited

U.S. PATENT DOCUMENTS 6,666,713 B1 * 12/2003 Norvelle ............... H01H 71/082
174/53
6,767,219 B2 * 7/2004 Maruyama ........... G01R 1/0675
324/756.02

(Continued)

FOREIGN PATENT DOCUMENTS

DE  2020170014254   7/2017
JP     2006108057    4/2006

(Continued)

OTHER PUBLICATIONS

Korean Application No. 20-2017-0001277, Office Action dated Jun. 29, 2018, 13 pages (6 pages of English translation and 7 pages of official).

*Primary Examiner* — Tho D Ta
(74) *Attorney, Agent, or Firm* — Kilpatrick Townsend & Stockton, LLP

(57) ABSTRACT

Contacts that may be highly corrosion resistant, may be readily manufactured, and may conserve precious materials. One example may provide contacts having a layer of a precious-metal alloy to improve corrosion resistance. The precious-metal-alloy layer may be plated with a hard, durable, wear and corrosion resistant plating stack for further corrosion resistance and wear improvement. The resources consumed by a contact may be reduced by forming a bulk or substrate region of the contact using a more readily available material, such as copper or a material that is primarily copper based.

20 Claims, 30 Drawing Sheets

Related U.S. Application Data filed on Sep. 2, 2016, provisional application No. 62/384,120, filed on Sep. 6, 2016.

(51) Int. Cl.

| | |
|---|---|
| *H01R 13/40* | (2006.01) |
| *B32B 15/00* | (2006.01) |
| *C22C 5/00* | (2006.01) |
| *C22C 5/02* | (2006.01) |
| *C22C 5/04* | (2006.01) |
| *C22C 9/00* | (2006.01) |
| *C22C 9/02* | (2006.01) |
| *C22C 9/04* | (2006.01) |
| *C22C 9/06* | (2006.01) |
| *H01R 24/60* | (2011.01) |

(52) U.S. Cl.
CPC .................. *C22C 5/04* (2013.01); *C22C 9/00* (2013.01); *C22C 9/02* (2013.01); *C22C 9/04* (2013.01); *C22C 9/06* (2013.01); *H01R 13/40* (2013.01); *H01R 24/60* (2013.01)

(56) References Cited

U.S. PATENT DOCUMENTS

| | | | | |
|---|---|---|---|---|
| 8,637,165 | B2* | 1/2014 | Siahaan | H01R 13/03 200/269 |
| 8,747,155 | B2* | 6/2014 | Weber | H01R 43/24 439/589 |
| 8,936,857 | B2* | 1/2015 | Dadvand | B32B 15/018 428/673 |
| 2013/0084758 | A1* | 4/2013 | Mizuta | H01R 13/03 439/733.1 |
| 2013/0084759 | A1* | 4/2013 | Mizuta | H01R 13/03 439/733.1 |
| 2013/0084760 | A1 | 4/2013 | Siahaan et al. | |
| 2014/0073201 | A1 | 3/2014 | Weber et al. | |

FOREIGN PATENT DOCUMENTS

| | | |
|---|---|---|
| JP | 2015048512 | 3/2015 |
| JP | 3211820 | 11/2017 |

\* cited by examiner

PRECIOUS-METAL-ALLOY CONTACTS

CROSS-REFERENCES TO RELATED APPLICATIONS

This application claims the benefit of U.S. patent application Ser. No. 62/310,445, filed Mar. 18, 2016, 62/383,381, filed Sep. 2, 2016, and 62/384,120, filed Sep. 6, 2016, which are incorporated by reference.

BACKGROUND

Electronic devices often include one or more connector receptacles though which they may provide and receive power and data. Power and data may be conveyed over cables that include a connector insert at each end of a cable. The connector inserts may be inserted into receptacles in the communicating electronic devices. In other electronic systems, contacts on a first device may be in direct contact with contacts on a second device without the need for an intervening cable. In such systems, a first connector may be formed as part of the first electronic device and a second connector may be formed as part of the second electronic device.

The contacts in these various connectors may be exposed to liquids and fluids that may cause the contacts to corrode. For example, a user may purposely or inadvertently submerge an electronic device or a connector insert in a liquid. A user may spill a liquid or perspire on contacts on an electronic device or connector insert. This may cause one or more contacts to corrode, particularly where a voltage is present on the one or more contacts. This corrosion may impair the operation of the electronic device or cable and in severe cases may render the device or cable inoperable. Even where operation is not impaired, corrosion may mar the appearance of the contacts. Where the contacts are at the surface of an electronic device or at the surface of a connector insert on a cable, such corrosion may be readily apparent to a user and it may create a negative impression in the mind of a user that may reflect poorly on the device or cable and the device or cable's manufacturer.

Some of these electronic devices may be very popular and may therefore be manufactured in great numbers. Therefore it may be desirable that these contacts be readily manufactured such that demand for the devices may be met. It may also be desirable to reduce the consumption of rare or precious materials.

Thus, what is needed are contacts that may be highly corrosion resistant, may be readily manufactured, and may conserve precious materials.

SUMMARY

Accordingly, embodiments of the present invention may provide contacts that may be highly corrosion resistant, may be readily manufactured, and may conserve precious materials. These contacts may be located at a surface of an electronic device, at a surface of a connector insert, or in a connector insert on a cable, in a connector receptacle on an electronic device, or elsewhere in a connector system.

An illustrative embodiment of the present invention may provide connector contacts that include a layer or portion formed of a precious-metal alloy to improve corrosion resistance. The precious-metal-alloy layer may be plated for further corrosion resistance and wear improvement. Resources may be conserved by forming a bulk or substrate region of the contact using a more common material, such as copper or a material that is primarily copper based. The combination of a precious-metal alloy and a more common bulk or substrate region may provide contacts having both improved corrosion resistance and a lower overall precious resource consumption.

In these and other embodiments of the present invention, the precious-metal-alloy layer or contact portion may be formed of a high-entropy material. Examples of this material may include material consistent with ASTM Standards B540, B563, B589, B683, B685, or B731, yellow gold, or other materials. The material for the precious-metal-alloy layer may be selected to have a good hardness and strength, as well as a high conductivity or low electrical resistance such that contact resistance is reduced. In various embodiments of the present invention, the precious-metal-alloy layer may have a Vickers hardness below 100, between 100-200, between 200-300, over 300, or a hardness in another range. A material having a good formability and high elongation for improved manufacturability may be selected for use as the precious-metal alloy. In these and other embodiments of the present invention, a precious-metal-alloy layer may have a thickness less than 10 micrometers, more than 10 micrometers, from 10 micrometers to 100 micrometers, from 10 micrometers to hundreds of micrometers, more than 100 micrometers, from 100 micrometers to hundreds of micrometers, or it may have a thickness in a different range of thicknesses. In these and other embodiments of the present invention, portions of, or all of a contact, may be formed of a precious-metal alloy.

In these and other embodiments of the present invention, the precious-metal-alloy layer may be clad over a substrate formed of a more common material, though in other embodiments of the present invention, portions of, or all of a contact, may be formed of a precious-metal alloy. This substrate may be formed using a material that is copper or copper based, such as phosphor bronze. In these and other embodiments of the present invention, the substrate may be formed using copper-nickel-tin, copper-nickel-silver alloy, steel, or other appropriate material or alloy. Material having good electrical conductivity and a good availability may be selected for use to form the contact substrate. The material may also be selected to have a good formability, elongation, and hardness that are similar to that of the material used for the precious-metal-alloy layer. In various embodiments of the present invention, the substrate layer may have a Vickers hardness below 100, between 100-200, between 200-300, over 300, or a hardness in another range. In these and other embodiments of the present invention, the bulk or substrate layer may form the majority of the contact and may have a thickness less than 1 mm, more than 1 mm, between 0.5 mm and 1.5 mm, approximately 1.0 mm, between 1 mm and 10 mm, more than 10 mm, or it may have a thickness in a different range of thicknesses.

In these and other embodiments of the present invention, a diffusion or bonding layer may be formed when the precious-metal alloy is bonded or clad to the substrate. This bonding layer may be an intermetallic bond of the precious-metal alloy and the alloy of the substrate. This diffusion or bonding layer may be less than 1 micrometer, more than 1 micrometer, 1 to 5 micrometers, 5 micrometers, or more than 5 micrometers thick.

In these and other embodiments of the present invention, one or more intermediate layers may be placed between the precious-metal-alloy layer and the substrate. These intermediate layers may have better corrosion resistance than copper and may also be more readily available than the material used as the precious-metal alloy. The one or more intermediate layers may be formed using titanium, steel, tantalum, or other material. This material may be selected based on its availability, formability, elongation, hardness, conductivity, ability to be stamped, or other property.

In these and other embodiments of the present invention, the precious-metal-alloy layer may be plated with a hard, durable, wear and corrosion resistant plating stack. This stack may be formed of one or more plating layers.

A first plating layer may be plated over the precious-metal-alloy layer for leveling and adhesion. For example, gold, copper, or other material may act as a leveler and tend to fill vertical differences across a surface of the precious-metal-alloy layer. This may help to cover defects in the substrate, such as nodules or nodes that may be left behind by an electropolish or chemical polishing step. This first plating layer may also provide adhesion between the precious-metal-alloy layer and a second plating layer or top plate. Instead of gold or copper, the first plating layer may be formed of nickel, tin, tin copper, hard gold, gold cobalt, or other material, though in other embodiments of the present invention, the first plating layer may be omitted. This first plating layer may have a thickness less than 0.01 micrometers, between 0.01 and 0.05 micrometers, between 0.05 and 0.1 micrometers, between 0.0.5 and 0.15 micrometers, more than 0.1 micrometers, or it may have a thickness in a different range of thicknesses.

In these and other embodiments of the present invention, a top plate may be plated over the first plating layer. The top plate may provide a durable contacting surface for when the contact on the electronic device housing the contact is mated with a corresponding contact on a second electronic device. In various embodiments of the present invention, the top plate may have a Vickers hardness below 100, between 100-200, between 200-300, over 300, or a hardness in another range. The top plate may be formed using rhodium ruthenium, dark rhodium, dark ruthenium, gold copper, or other alternatives. The use of rhodium ruthenium or rhodium may help oxygen formation, which may reduce its corrosion. The percentage of rhodium may be between 85 to 100 percent by weight, for example, it may be 95 or 99 percent by weight, where the most or all of the remaining material is ruthenium. This material may be chosen for its color, wear, hardness, conductivity, scratch resistance, or other property. This top plate may have a thickness less than 0.5 micrometers, between 0.5 and 0.75 micrometers, between 0.75 and 0.85 micrometers, between 0.85 and 1.1 micrometers, more than 1.1 micrometers, or it may have a thickness in a different range of thicknesses.

In these and other embodiments of the present invention, instead of a top plate being plated over the first plating layer, a second plating layer may be plated over the first plating layer. The second plating layer may act as a barrier layer to prevent color leakage from the precious-metal-alloy layer to the surface of the contact, and the material used for the second plating layer may be chosen on this basis. In these and other embodiments of the present invention, the second plating layer may be formed using nickel, palladium, tin-copper, silver, or other appropriate material. The use of palladium or other material may provide a second plating layer that is more positively charged than a top plate of rhodium ruthenium, rhodium, or other material. This may cause the top plate to act as a sacrificial layer, thereby protecting the underlying palladium. This second plating layer may have a thickness less than 0.1 micrometers, between 0.1 and 0.5 micrometers, between 0.5 and 1.0 micrometers, between 1.0 and 1.5 micrometers, more than 1.0 micrometers, or it may have a thickness in a different range of thicknesses.

In these and other embodiments of the present invention, the first plating layer may be omitted and the second plating layer may be plated directly on the precious-metal layer.

In these and other embodiments of the present invention, a third plating layer may be plated over the second plating layer. The third plating layer may, like the first plating layer, provide leveling and adhesion. For example, gold may tend to fill vertical differences across a surface of the second plating layer, the barrier layer, and may provide adhesion between the second plating layer and a top plate. For example, a gold plating layer may provide adhesion between a second plating layer of palladium and a top plate of rhodium ruthenium. The gold layer may be a plated gold strike. Instead of gold, the third plating layer may be formed of nickel, copper, tin, tin copper, hard gold, gold cobalt, or other material. This third plating layer may have a thickness less than 0.01 micrometers, between 0.01 and 0.05 micrometers, between 0.05 and 0.1 micrometers, between 0.05 and 0.15 micrometers, more than 0.1 micrometers, or it may have a thickness in a different range of thicknesses.

In these and other embodiments of the present invention, the third plating layer may be omitted and the top plate may be plated directly on the second plating layer.

In these and other embodiments of the present invention, the top plate described above may be plated over the third plating layer.

In these and other embodiments of the present invention, the plating materials used may be selected based a desire to conserve precious resources, formability, elongation, hardness, conductivity, ability to be stamped, or other property.

These contacts may be formed in various ways in various embodiments of the present invention. In an illustrative embodiment of the present invention, a layer of precious-metal alloy may at least partially cover a layer of substrate material. As described herein, one or more intermediate layers may be placed between the layer of precious-metal alloy and the substrate. Contacts may be stamped such that a precious-metal-alloy layer may be clad to a bulk or substrate layer, or over the bulk or substrate layer with one or more intermediate layers. The materials used may be heated (and possibly annealed) and elongated during the stamping. For example, a 35, 50, or 70 percent elongation may be used.

In these and other embodiments of the present invention, carriers may be stamped of the bulk material. These carriers may be used to carry or otherwise manipulate the contacts during further manufacturing steps, such as blasting, polishing, sanding, plating (for example, as described herein), further annealing, or other process steps.

In these and other embodiments of the present invention, the layer of precious-metal alloy may be placed on a top surface of a layer of bulk or substrate material before stamping. In other embodiments of the present invention, one or more grooves may be formed in the layer of bulk or substrate material and the layer of precious-metal alloy may be placed in the one or more grooves. In these and other embodiments of the present invention, one or more of the grooves may be deeper than one or more of the remaining grooves. In this way a layer of precious-metal alloy in a contact may have a greater depth along at least a portion of the sides of the contact. This may help to improve corrosion resistance along sides of the resulting contacts.

In these and other embodiments of the present invention, contacts may be formed in other ways and have different plating layers. For example, strips of a copper alloy or other material may be butt-welded or otherwise fixed or attached to sides of a strip of a precious-metal alloy to form a strip or roll of material for stamping. Contacts may be stamped such that all of the contact is formed of the precious-metal alloy while a carrier is formed of the copper alloy or other material. Contacts may also be stamped such that only portions, such as a contacting portion, may be formed of the precious-metal alloy while the remainder of the contact and a carrier may be formed of the copper alloy or other material in order to conserve resources.

These and other embodiments of the present invention may include various plating layers at a contacting portion or other portion of a contact. In one example a contact substrate may be stamped, for example from a sheet or strip of copper, or a strip that includes strips of copper welded to sides of a strip of a precious-metal alley. An electropolish step may be used to removing stamping burrs, which could otherwise expose nickel silicides or other particles in the substrate. Unfortunately, the electropolish step may leave nodules on the contact surface. Chemical polish may be used in its place, though that may leave nodes behind on the contact surface.

Accordingly, a first plating layer to provide a surface leveling may be plated on the substrate. This first plating layer may be copper or other material, such as gold, nickel, tin, tin copper, hard gold, or gold cobalt, and it may be plated over the contact substrate to level the surface of the stamped substrate and cover nodules left by electropolishing or nodes left by chemical polishing as well as remaining burrs or other defects from the stamping process. In these other embodiments of the present invention, the first plating layer may be sufficient and an electropolish step may be omitted. The first plating layer may also provide adhesion between the substrate and a second plating layer that may be plated over the first plating layer. The first plating layer may have a thickness of 0.5 to 1.0 micrometers, 1.0 to 3.0 micrometers, 3.0 to 4.5 micrometers, 3.0 to 5.0 micrometers, or more than 5.0 micrometers, or it may have a thickness in a different range of thicknesses.

Cracks in these plating layers may provide pathways for fluids that may cause corrosion. Accordingly, a second, harder plating layer to prevent layers above the second plating layer from cracking may be plated over the first plating layer. This second plating layer may be formed of an electroless nickel composite. This second plating layer may have a thickness of 0.5 to 1.0 micrometers, 1.0 to 2.0 micrometers, 2.0 to 5.0 micrometers, or more than 5.0 micrometers, or it may have a thickness in a different range of thicknesses. In various embodiments of the present invention, this second layer may be omitted.

A third plating layer may work in conjunction with the second plating layer. The third plating layer may be plated over the second plating layer. This third plating layer may be soft to absorb shock and thereby minimize cracking in the layers above the third plating layer. The third plating layer may be gold or other material such as copper, nickel, tin, tin copper, hard gold, or gold cobalt. The third plating layer may provide adhesion between its neighboring layers and may provide a leveling effect as well. This third plating layer may have a thickness of 0.55 to 0.9 micrometers, 0.5 to 1.25 micrometers, 1.25 to 2.5 micrometers, 2.5 to 5.0 micrometers, or more than 5.0 micrometers, or it may have a thickness in a different range of thicknesses. In various embodiments of the present invention, these second and third plating layers may be omitted, or the second layer may be omitted, though other layers may be added or omitted as well.

A fourth plating layer to provide corrosion resistance may be plated over the third plating layer. The fourth plating layer may act as a barrier layer to prevent color leakage to the surface of the contact, and the material used for the fourth plating layer may be chosen on this basis. This layer may be formed of palladium or other material such as nickel, tin-copper, or silver. The use of palladium or other material may provide a second plating layer that is more positively charged than a top plate of rhodium ruthenium, rhodium, or other material. This may cause the top plate to act as a sacrificial layer, thereby protecting the underlying palladium. This layer may be somewhat harder than a fifth plating layer above it, which may prevent layers above the fourth plating layer from cracking when exposed to pressure during a connection. The fourth plating layer may have a thickness of 0.5 to 0.8 micrometers, 0.5 to 1.0 micrometers, 1.0 to 1.5 micrometers, 1.5 to 3.0 micrometers, or more than 3.0 micrometers, or it may have a thickness in a different range of thicknesses. When palladium is used, it may be plated at a rate of 0.6 plus or minus 0.1 ASD or other appropriate rate.

A fifth plating layer to act as an adhesion layer between the fourth plating layer and a top plate may be plated over the fourth plating layer. The fifth plating layer may be gold or other material such as copper, nickel, tin, tin copper, hard gold, or gold cobalt. The fifth plating layer may provide further leveling as well. The fifth plating layer may have a thickness of 0.02 to 0.05 micrometers, 0.05 to 0.15 micrometers, 0.10 to 0.20 micrometers, 0.15 to 0.30 micrometers, or more than 0.30 micrometers, or it may have a thickness in a different range of thicknesses.

A top plate may be formed over the fifth plating layer. The top plate may be highly corrosive and wear resistant. This layer may be thinned in high-stress locations to reduce the risk of cracking. The top plate may provide a durable contacting surface for when the contact on the electronic device housing the contact is mated with a corresponding contact on a second electronic device. In various embodiments of the present invention, the top plate may have a Vickers hardness below 100, between 100-200, between 200-300, over 300, or a hardness in another range. The top plate may be formed using rhodium ruthenium, dark rhodium, dark ruthenium, gold copper, or other alternatives. The use of rhodium ruthenium or rhodium may help oxygen formation, which may reduce its corrosion. The percentage of rhodium may be between 85 to 100 percent by weight, for example, it may be 95 or 99 percent by weight, where the most or all of the remaining material is ruthenium. This material may be chosen for its color, wear, hardness, conductivity, scratch resistance, or other property. The top plate may have a thickness less than 0.5 micrometers, between 0.5 and 0.75 micrometers, between 0.65 and 1.0 micrometers, between 0.75 and 1.0 micrometers, between 1.0 and 1.3 micrometers, more than 1.3 micrometers, or it may have a thickness in a different range of thicknesses.

In various embodiments of the present invention, these layers may be varied. For example, the top plate may be omitted over portions of the contact for various reasons. For example, where a contact has a surface-mount or through-hole contacting portion to be soldered to a corresponding contact on a printed circuit board, the top plate may be omitted from the surface-mount or through-hole contacting portion to improve solderability. In other embodiments of the present invention, other layers, such as the second and third plating layers, may be omitted.

In these and other embodiments of the present invention, one or more plating layers may be applied at a varying thickness along a length of the contact. In these embodiments, drum plating may be used. A contact on a carrier may be aligned with a window on an outside drum though which physical vapor deposition or other plating may occur. The window on the outside drum may have an aperture that is varied during rotation by an inside drum, the inside drum inside the outside drum.

These contacts may each have a high wear contacting portion to mate with a contact in a corresponding connector. They may have a low-stress beam portion, a high-stress beam portion, and a contacting portion, such as a surface-mount or through-hole contacting portion for mating with a corresponding contact on a printed circuit board or other appropriate substrate. A substrate for the contact may be stamped, for example from a sheet or strip of copper, or a strip that includes strips of copper welded to sides of a strip of a precious-metal alley. An electropolish or chemical polish step may be used to removing stamping burrs, though they may leave nodules or nodes on the contact surface.

Accordingly, a first plating layer to provide a surface leveling may be plated on the substrate. This first plating layer may be copper or other material such as gold, nickel, tin, tin copper, hard gold, or gold cobalt, or other material, and it may be plated over the contact substrate to level the surface of the stamped substrate. In these other embodiments of the present invention, the first plating layer may be sufficient and an electropolish step may be omitted. This first plating layer may also provide adhesion between its neighboring substrate and second plating layer. The first plating layer may have a thickness of 0.5 to 1.0 micrometers, 1.0 to 3.0 micrometers, 3.0 to 5.0 micrometers, or more than 5.0 micrometers, or it may have a thickness in a different range of thicknesses.

A second plating layer to provide corrosion resistance may be plated over first plating layer. The second plating layer may act as a barrier layer to prevent color leakage to the surface of the contact, and the material used for the second plating layer may be chosen on this basis. This second plating layer may be formed of palladium or other material such as nickel, tin-copper, or silver. The use of palladium or other material may provide a second plating layer that is more positively charged than a top plate of rhodium ruthenium, rhodium, or other material. This may cause the top plate to act as a sacrificial layer, thereby protecting the underlying palladium. This layer may be somewhat harder than a third plating layer above it, which may prevent layers above the third plating layer from cracking when exposed to pressure during a connection. The second plating layer may have a thickness that varies along a length of the contact. For example, it may vary from of 0.1 to 0.2 micrometers, 0.2 to 0.3 micrometers, 0.3 to 0.5 micrometers, 0.3 to 1.5 micrometers, 1.0 to 1.5 micrometers or more than 1.5 micrometers, or it may have a thickness in a different range of thicknesses along a length of a contact. The second plating layer may be thicker near a high-wear contacting portion, and it may thin away from the high-wear region.

A third plating layer to act as an adhesion layer between the second plating layer and a top plate may be plated over the second plating layer. The third plating layer may be gold or other material such as copper, nickel, tin, tin copper, hard gold, or gold cobalt. The third plating layer may also provide a leveling effect. The third plating layer may have a thickness of 0.02 to 0.05 micrometers, 0.05 to 0.15 micrometers, 0.15 to 0.30 micrometers, or more than 0.30 micrometers, or it may have a thickness in a different range of thicknesses along a length of a contact.

A top plate may be formed over the third plating layer. The top plate may be highly corrosive and wear resistant. This top plate may be thinned in the high-stress beam portion to reduce the risk of cracking. The top plate may provide a durable contacting surface for when the contact on the electronic device housing the contact is mated with a corresponding contact on a second electronic device. In various embodiments of the present invention, the top plate may have a Vickers hardness below 100, between 100-200, between 200-300, over 300, or a hardness in another range. The top plate may be formed using rhodium ruthenium, dark rhodium, dark ruthenium, gold copper, or other alternatives. The use of rhodium ruthenium or rhodium may help oxygen formation, which may reduce its corrosion. The percentage of rhodium may be between 85 to 100 percent by weight, for example, it may be 95 or 99 percent by weight, where the most or all of the remaining material is ruthenium. This material may be chosen for its color, wear, hardness, conductivity, scratch resistance, or other property. The top plate may have a thickness less than 0.3 micrometers, between 0.3 and 0.55 micrometers, between 0.3 and 1.0 micrometers, between 0.75 and 1.0 micrometers, more than 1.0 micrometers, or it may have a thickness in a different range of thicknesses. Again, the top plate may be omitted from the surface-mount or through-hole contacting portion. The top plate may be thicker near a high-wear contacting portion, and it may thin away from the high-wear region.

In these and other embodiments of the present invention, other layers may be formed on contacts to prevent wear and corrosion. For example, a plastic insulating layer may be formed using electroplastic deposition or electro deposition (ED). This layer may cover portion of a contact to prevent corrosion. A contacting portion of the contact may remain exposed such that it may form an electrical connection with a contact in a corresponding connector. Also, a surface-mount or through-hole contact portion may remain exposed such that it may be soldered to a corresponding contact on a board or other appropriate substrate.

While embodiments of the present invention are well-suited to contact structures and their method of manufacturing, these and other embodiments of the present invention may be used to improve the corrosion resistance of other structures. For example, electronic device cases and enclosures, connector housings and shielding, battery terminals, magnetic elements, measurement and medical devices, sensors, fasteners, various portions of wearable computing devices such as clips and bands, bearings, gears, chains, tools, or portions of any of these, may be covered with a precious-metal alloy and plating layers as described herein and otherwise provided for by embodiments of the present invention. The precious-metal alloy and plating layers for these structures may be formed or manufactured as described herein and otherwise provided for by embodiments of the present invention. For example, magnets and other structures for fasteners, connectors, speakers, receiver magnets, receiver magnet assemblies, microphones, and other devices may have their corrosion resistance improved by structures and methods such as those shown herein and in other embodiments of the present invention.

In various embodiments of the present invention, the components of contacts and their connector assemblies may be formed in various ways of various materials. For example, contacts and other conductive portions may be formed by stamping, coining, metal-injection molding, machining, micro-machining, 3-D printing, or other manufacturing process. The conductive portions may be formed of stainless steel, steel, copper, copper titanium, phosphor bronze, palladium, palladium silver, or other material or combination of materials, as described herein. They may be plated or coated with nickel, gold, palladium, or other material, as described herein. The nonconductive portions, such as the housings and other portions, may be formed using injection or other molding, 3-D printing, machining, or other manufacturing process. The nonconductive portions may be formed of silicon or silicone, Mylar, Mylar tape, rubber, hard rubber, plastic, nylon, elastomers, liquid-crystal polymers (LCPs), ceramics, or other nonconductive material or combination of materials.

Embodiments of the present invention may provide contacts and their connector assemblies that may be located in, or may connect to, various types of devices, such as portable computing devices, tablet computers, desktop computers, laptops, all-in-one computers, wearable computing devices, cell phones, smart phones, media phones, storage devices, keyboards, covers, cases, portable media players, navigation systems, monitors, power supplies, adapters, remote control devices, chargers, and other devices. These contacts and their connector assemblies may provide pathways for signals that are compliant with various standards such as Universal Serial Bus (USB), High-Definition Multimedia Interface® (HDMI), Digital Visual Interface (DVI), Ethernet, DisplayPort, Thunderbolt™, Lightning, Joint Test Action Group (JTAG), test-access-port (TAP), Directed Automated Random Testing (DART), universal asynchronous receiver/transmitters (UARTs), clock signals, power signals, and other types of standard, non-standard, and proprietary interfaces and combinations thereof that have been developed, are being developed, or will be developed in the future. In various embodiments of the present invention, these interconnect paths provided by these connectors may be used to convey power, ground, signals, test points, and other voltage, current, data, or other information.

Various embodiments of the present invention may incorporate one or more of these and the other features described herein. A better understanding of the nature and advantages of the present invention may be gained by reference to the following detailed description and the accompanying drawings.

DESCRIPTION OF ILLUSTRATIVE EMBODIMENTS

Figure 1:
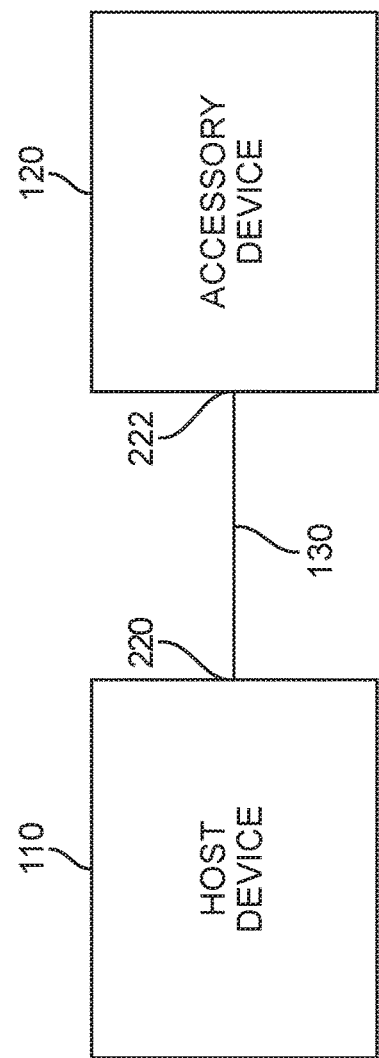
FIG. 1 illustrates an electronic system according to an embodiment of the present invention.

FIG. 1 illustrates an electronic system according to an embodiment of the present invention. This figure, as with the other included figures, is shown for illustrative purposes and does not limit either the possible embodiments of the present invention or the claims.

In this example, host device 110 may be connected to accessory device 120 in order to share data, power, or both. Specifically, contacts 220 on host device 110 may be electrically connected to contacts 222 on accessory device 120. Contacts 220 on host device 110 may be electrically connected to contacts 222 on accessory device 120 via cable 130. In other embodiments of the present invention, contacts 220 on host device 110 may be in physical contact and directly and electrically connected to contacts 222 on accessory device 120.

To facilitate a direction connection between contacts 220 on host device 110 and contacts 222 on accessory device 120, contacts 220 on host device 110 and contacts 222 on accessory device 120 may be located on the surfaces of their respective devices. But this location may make them vulnerable to exposure to liquids or other fluids. This exposure, particularly when there are voltages present on the exposed contacts, may lead to their corrosion. This corrosion may mar the contacts and may be readily apparent to a user. This corrosion may lead to a reduction in operation of the device and may even render the device inoperable. Even when such corrosion does not reach the level of device impairment, it may create a negative impression in the mind of a user that may reflect poorly on the device and the device's manufacturer.

Accordingly, embodiments of the present invention may provide contacts that may be highly corrosion resistant. But ordinarily, such an increase in corrosion resistance may lead to a reduction in manufacturability. Accordingly, embodiments of the present invention may provide contacts that are readily manufactured and may be manufactured using a limited amount of precious resources. Examples are shown in the following figures.

Figure 2:
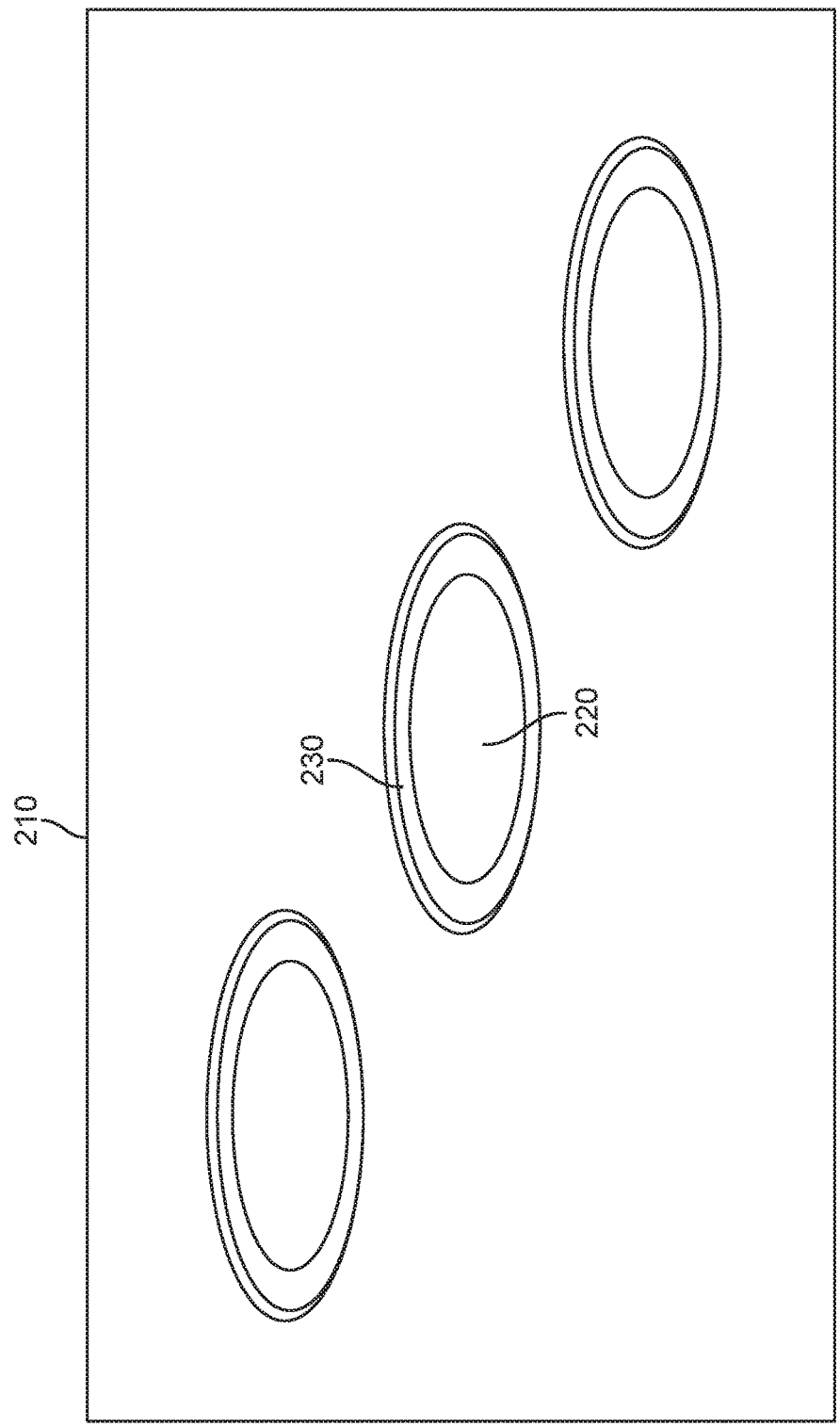
FIG. 2 illustrates a plurality of contacts according to an embodiment of the present invention at a surface of an electronic device.

FIG. 2 illustrates a plurality of contacts according to an embodiment of the present invention at a surface of an electronic device. In this example, contacts 220 are shown as being at a surface of an enclosure 210. Contacts 210 may be insulated from device enclosure 210 by contact assembly housing 230. In other embodiments of the present invention, for example where housing 210 is nonconductive, the insulation provided by contact assembly housing 230 may not be needed and contact assembly housing 230 may be omitted. In still other embodiments of the present invention, contacts 220 may be used in a connector insert (such as a connector insert shown herein), connector receptacle, or other connector structure.

In the following examples, contacts 220 are shown in greater detail. In these and the other embodiments of the present invention, contacts 222 on accessory device 120 may be the same as, substantially similar to, similar to, or different than contacts 220 on host device 110.

In various embodiments of the present invention, a surface of device enclosure 210 may have various shapes or contours. For example, housing 210 may be flat, curved, or have other shapes. Surfaces of contacts 220 may be similarly contoured such that the surfaces of contacts 220 match the adjacent or local contours of device enclosure 210. In these and other embodiments of the present invention, housing 210 portions may be similarly contoured to match the adjacent or local contours of contacts 220 and device enclosure 210. While three contacts of similar size are shown in this example, in other embodiments of the present invention, other numbers of contacts, such as two, four, or more than four contacts may be employed and one or more of these contacts may be of a different size.

Figure 3:
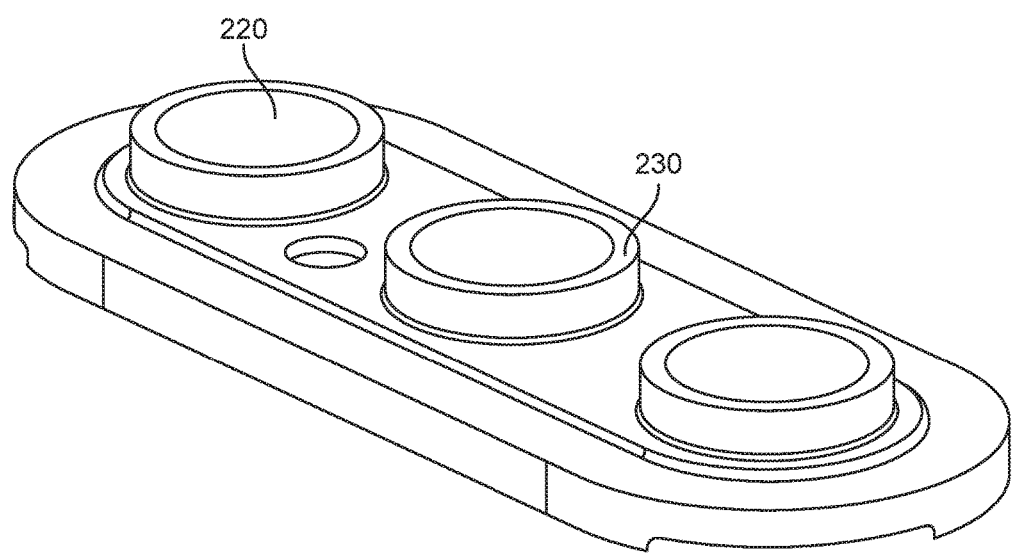
FIG. 3 illustrates a plurality of contacts in a contact assembly housing according to an embodiment of the present invention.

FIG. 3 illustrates a plurality of contacts in a contact assembly housing according to an embodiment of the present invention. In this example, contacts 220 may be located in a contact housing 230. In various embodiments of the present invention, undersides of contacts 220 may mate with a flexible circuit board, printed circuit board, or other appropriate substrate.

Figure 4:
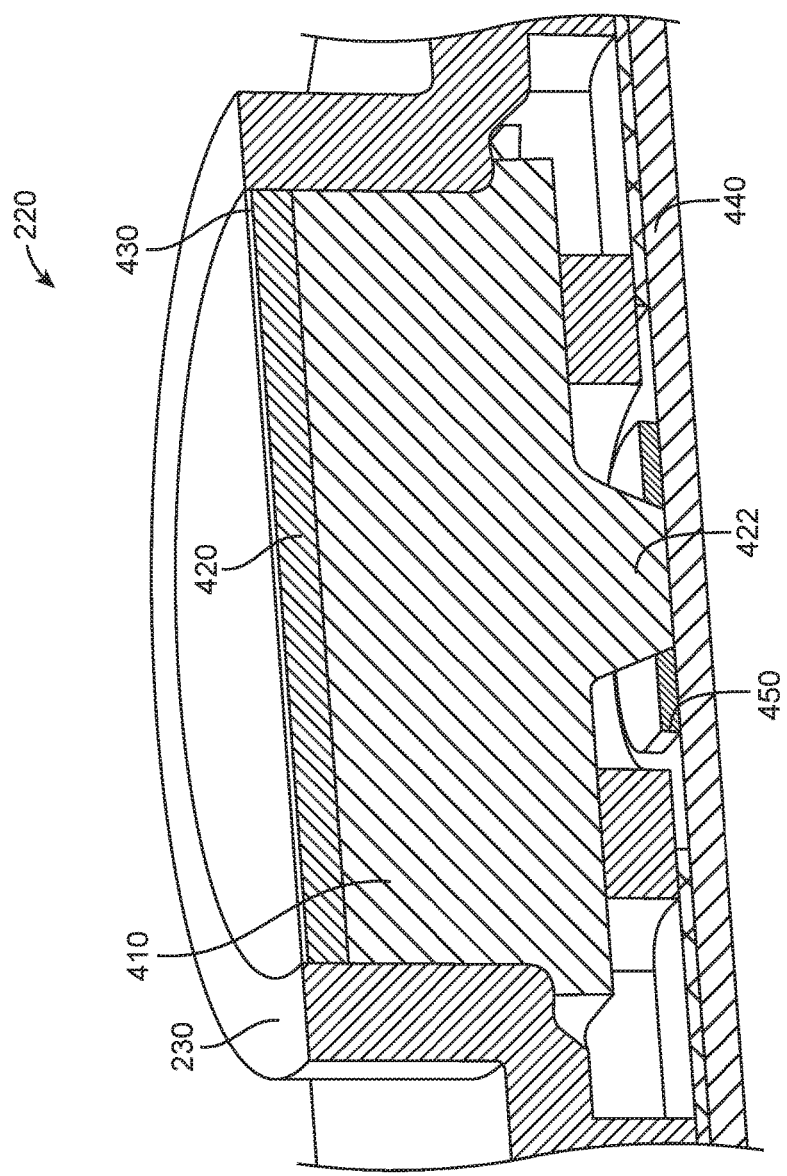
FIG. 4 illustrates a cross-section of a contact according to an embodiment of the present invention.

FIG. 4 illustrates a cross-section of a contact according to an embodiment of the present invention. As before, contact 220 is shown as being located in contact assembly housing 230. Contact 220 may include bulk or substrate layer 410. Contact 220 may have a primarily disk-shape, though contact 220 may have other shapes consistent with embodiments of the present invention. Bulk or substrate layer 410 may include narrow portion 422, which may be electrically connected by solder region 450 to board 440. Board 440 may be a flexible circuit board, printed circuit board, or other appropriate substrate. Board 440 may connect to electrical or mechanical, components in the electronic device housing contact 220. In this way, power and signals may be transferred between this electronic device and a second electronic device via contacts 220.

Contact 220 may include bulk or substrate layer 410. The resources consumed by contact 220 may be reduced by forming the bulk or substrate layer 410 using a more readily available material, such as copper or a material that is primarily copper based, such as phosphor bronze. In these and other embodiments of the present invention, the bulk or substrate layer 410 may be formed using copper-nickel-tin, copper-nickel-silver alloy, steel, or other appropriate material or alloy. Material having good electrical conductivity and a good availability may be selected for use to form the bulk or substrate layer 410. The material may also be selected to have a good formability or elongation and hardness similar to that of the material used for the precious-metal-alloy layer 420. In various embodiments of the present invention, the substrate layer may have a Vickers hardness below 100, between 100-200, between 200-300, over 300, or a hardness in another range. In these and other embodiments of the present invention, the bulk or substrate layer 410 may form the majority of the contact and may have a thickness less than 1 mm, more than 1 mm, between 0.5 mm and 1.5 mm, approximately 1.0 mm, between 1 mm to 10 mm, more than 10 mm, or it may have a thickness in a different range of thicknesses.

Bulk or substrate layer 410 may be clad by a precious-metal-alloy layer 420. Precious-metal-alloy layer 420 may be a high entropy material, such as materials consistent with ASTM Standards B540, B563, B589, B683, B685, or B731, yellow gold, or other materials. The material for the precious-metal-alloy layer 420 may be selected to have a good hardness and strength, as well as a high conductivity or low electrical resistance. A material having a good formability or high elongation for improved manufacturability may be selected for use as the precious-metal alloy. In various embodiments of the present invention, the precious-metal-alloy layer 420 may have a Vickers hardness below 100, between 100-200, between 200-300, over 300, or a hardness in another range. In these and other embodiments of the present invention, the precious-metal-alloy layer 420 may have a thickness less than 10 micrometers, more than 10 micrometers, from 10 micrometers to 100 micrometers, from 10 micrometers to hundreds of micrometers, more than 100 micrometers, from 100 micrometers to hundreds of micrometers, or it may have a thickness in a different range of thicknesses.

In these and other embodiments of the present invention, one or more intermediate layers may be placed between the precious-metal-alloy layer 420 and the bulk or substrate layer 410. These intermediate layers may have better corrosion resistance than copper and may be more readily available than the material used as the precious-metal alloy. The one or more intermediate layers may be formed using titanium, steel, tantalum, or other material. This material may be selected based on its availability, formability, elongation, hardness, conductivity, ability to be stamped, or other property.

Cladding or precious-metal-alloy layer 420 may be plated by one or more plating layers, shown here as plating stack 430. Plating stacks, such as plating stack 430 may be used to provide a color match, or desired color mismatch, with a device enclosure 210 as shown in FIG. 1. Plating stacks, such as plating stack 430 may also be used to provide a hard, scratch resistant surface for contact 220. An example of such a plating stack is shown in the following figure.

Figure 5:
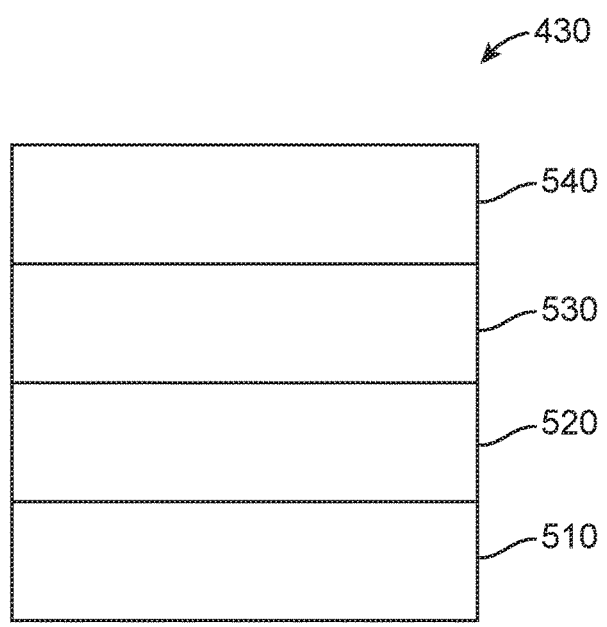
FIG. 5 illustrates a plating stack may be used to plate a contacting surface of a contact according to an embodiment of the present invention.

FIG. 5 illustrates a plating stack may be used to plate a contacting surface of a contact according to an embodiment of the present invention. This plating stack 430 may include a first plating layer 510 that may be plated over the precious-metal-alloy layer 420 as shown in FIG. 4 for leveling and adhesion. For example, gold may tend to fill vertical differences across a surface of the precious-metal-alloy layer 420. These vertical differences may include nodes and nodules that may be left behind by electropolishing and chemical polishing performed on the underlying material. First plating layer 510 may also provide adhesion between the precious-metal-alloy layer 420 and a second plating layer 520. Instead of gold, first plating layer 510 may be formed of nickel, copper, tin, tin copper, hard gold, gold cobalt, or other material. This first plating layer 510 may have a thickness less than 0.01 micrometers, between 0.01 and 0.05 micrometers, between 0.05 and 0.1 micrometers, between 0.05 and 0.15 micrometers, more than 0.1 micrometers, or it may have a thickness in a different range of thicknesses.

In these and other embodiments of the present invention, the first plating layer 510 may be omitted and the second plating layer 520 may be plated directly on the precious-metal layer.

In these and other embodiments of the present invention, a second plating layer 520 may be plated over first plating layer 510. Second plating layer 520 may act as a barrier layer to prevent color leakage from precious-metal-alloy layer 420 to the surface of contact 220, and the material used for second plating layer 520 may be chosen on this basis. In these and other embodiments of the present invention, second plating layer 520 may be formed using nickel, palladium, tin-copper, silver, or other appropriate material. The use of palladium or other material may provide a second plating layer 520 that is more positively charged than a top plate 540 of rhodium ruthenium, rhodium, or other material. This may cause the top plate 540 to act as a sacrificial layer, thereby protecting the underlying palladium in second plating layer 520. This second plating layer 520 may be somewhat harder than a third plating layer 530 above it, which may prevent layers above the third plating layer 530 from cracking when exposed to pressure during a connection. This second plating layer 520 may have a thickness less than 0.1 micrometers, between 0.1 and 0.5 micrometers, between 0.5 and 1.0 micrometers, between 1.0 and 1.5 micrometers, more than 1.0 micrometers, or it may have a thickness in a different range of thicknesses.

In these and other embodiments of the present invention, a third plating layer 530 may be plated over second plating layer 520. Third plating layer 530 may, like first plating layer 510, provide leveling and adhesion. For example, gold may tend to fill vertical differences across a surface of the second plating layer, the barrier layer, and may provide adhesion between second plating layer 520 and a top plate 540. Instead of gold, third plating layer 530 may be formed of nickel, palladium, copper, tin, tin copper, hard gold, gold cobalt, or other material. This third plating layer 530 may have a thickness less than 0.01 micrometers, between 0.01 and 0.05 micrometers, between 0.05 and 0.1 micrometers, between 0.05 and 0.15 micrometers, more than 0.1 micrometers, or it may have a thickness in a different range of thicknesses.

In these and other embodiments of the present invention, top plate 540 may be plated over third plating layer 530. Top plate 540 may provide a durable contacting surface for when contact 220 on the electronic device housing the contact is mated with a corresponding contact on a second electronic device. In various embodiments of the present invention, top plate 540 may have a Vickers hardness below 100, between 100-200, between 200-300, over 300, or a hardness in another range. Top plate 540 may be formed using rhodium ruthenium, dark rhodium, dark ruthenium, gold copper, or other alternatives. This material may be chosen for its color, wear, hardness, conductivity, scratch resistance, or other property. The use of rhodium ruthenium or rhodium may help oxygen formation, which may reduce the corrosion of top plate 540. The percentage of rhodium may be between 85 to 100 percent by weight, for example, it may be 95 or 99 percent by weight, where the most or all of the remaining material is ruthenium. Top plate 540 may have a thickness less than 0.5 micrometers, between 0.5 and 0.75 micrometers, between 0.75 and 0.85 micrometers, between 0.85 and 1.1 micrometers, more than 1.1 micrometers, or it may have a thickness in a different range of thicknesses.

In these and other embodiments of the present invention, third plating layer 530 may be omitted and top plate 540 may be plated directly on second plating layer 520.

In these and other embodiments of the present invention, top plate 540 may be plated directly over first plating layer 510 and second and third plating layers 520 and 530 may be omitted.

In these and other embodiments of the present invention, the plating materials used may be selected based on availability, formability, elongation, hardness, conductivity, ability to be stamped, or other property. These and the other contacts shown herein and consistent with embodiments of the present invention may be formed in various ways. An example is shown in the following figure.

Figure 6:
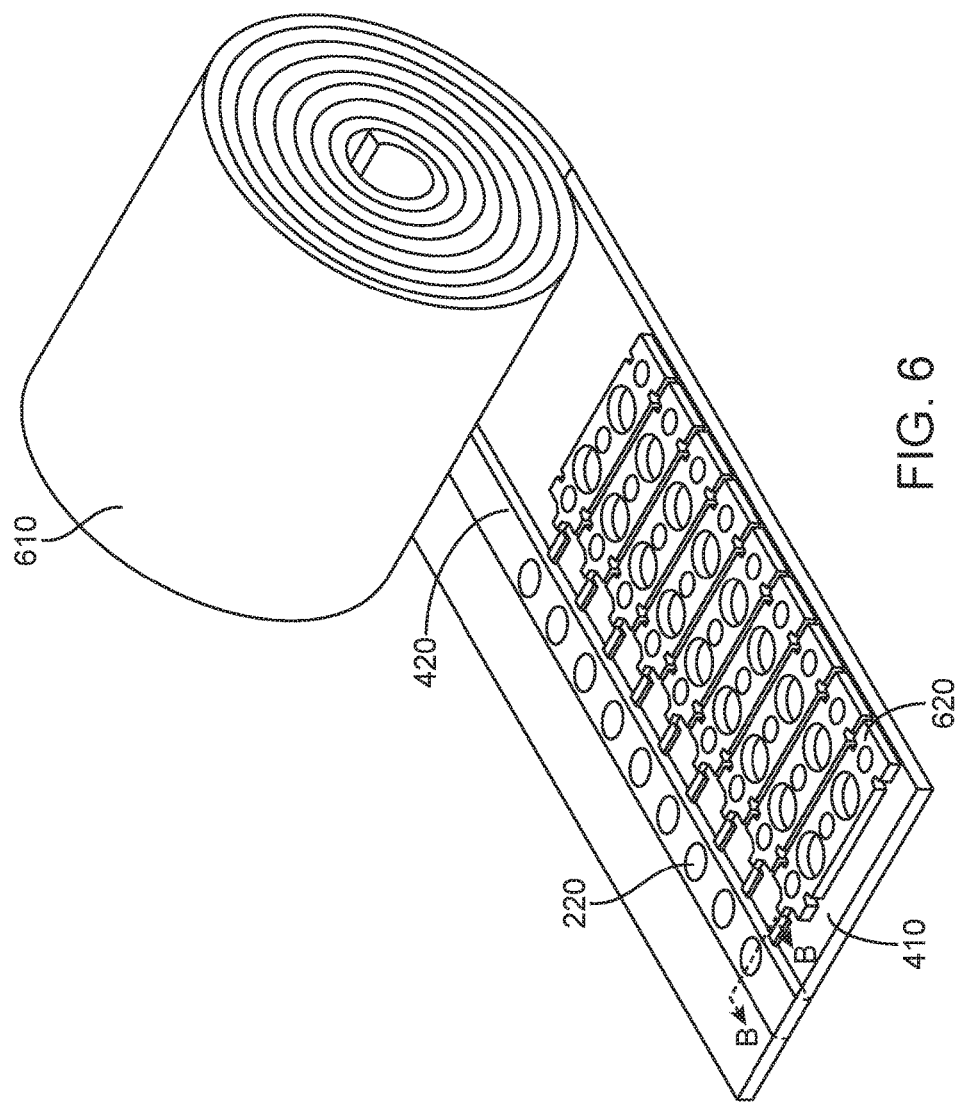
FIG. 6 illustrates a method of manufacturing contacts according to an embodiment of the present invention.

FIG. 6 illustrates a method of manufacturing contacts according to an embodiment of the present invention. This and similar methods may be used to manufacture the above and other contacts shown herein, as well as other contacts according to embodiments of the present invention. In this example, a bulk or substrate layer 410 may be at least partially covered by a layer of precious-metal alloy 420. These layers may be provided in rolls 610. Rolls 610 may be stamped or coined to form contacts 220. Carriers 620, attached to contacts 220, may similarly be stamped. Carriers 620 may be used to manipulate contacts 220 during later processing steps such as blasting, polishing, etching, annealing, or other processing steps. Contacts 220 may be stamped in a manner to efficiently utilize the precious-metal alloy 420. Unused material from precious-metal layers, such as precious-metal layer 420, and bulk or substrates, such as bulk or substrate 410, may be recycled or otherwise reused.

It may be very difficult to plate bulk or substrate layer 410 with a precious-metal alloy 420. Accordingly, in this embodiment of the present invention, contacts 220 may be stamped from bulk or substrate layer 410 and preciousmetal-alloy layer 420. This stamping process may be coining or other type of process. This stamping process may bond the precious-metal-alloy layer 420 to the bulk or substrate layer 410. This stamping process may be done at an elevated temperature (which may be used for annealing.) The material of roll 610 may be stretched or elongated during stamping or coining in order to bond the precious-metal-alloy layer 420 and bulk or substrate layer 410. For example, a 35, 50, or 70 percent elongation may be used.

In these and other embodiments of the present invention this diffusion or bonding layer may be formed when the precious-metal alloy is bonded or clad to the substrate. This bonding layer may be an intermetallic bond of the precious-metal alloy 420 and the alloy of the bulk or substrate layer 410. This diffusion or bonding layer may be less than 1 micrometer, more than 1 micrometer, 1 to 5 micrometers, 5 micrometers, or more than 5 micrometers thick.

This and similar processes may be used to form contacts described herein and in other embodiments of the present invention. An example of a stamped contact is shown in the following figure.

Figure 7:
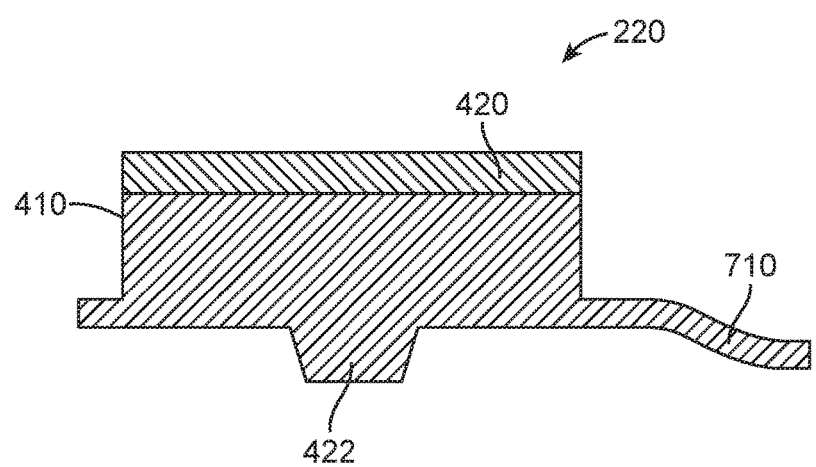
FIG. 7 illustrates a side view of a stamped or coined contact according to an embodiment of the present invention.

FIG. 7 illustrates a side view of a stamped or coined contact according to an embodiment of the present invention. Contact 220 may include a bulk or substrate layer 410 having a narrow portion 422. Narrow portion 422 may be soldered to a flexible circuit board, printed circuit board, or other appropriate substrate. Bulk or substrate layer 410 may be clad with a precious-metal-alloy layer 420. Tail portion 710 may remain after carrier 620 has been broken away or otherwise physically disconnected from contact 220. After stamping, contact 220 may be blasted, annealed, polished, plated, or subjected to other processing steps, as shown herein.

In the above examples, contacts 220 are shown as contacts at a surface of a device enclosure 210. In other embodiments of the present invention, the same or similar structures, layers, manufacturing, and processing steps may be used to form contacts for a connector insert or a connector receptacle, for example a connector receptacle where contacts are located in an opening in a device enclosure. Examples of such contacts that may be used in a connector insert or connector receptacle are shown in the following figures. These and other embodiments of the present invention may be used as contacts on a surface of a device or elsewhere as shown above as well.

Figure 8:
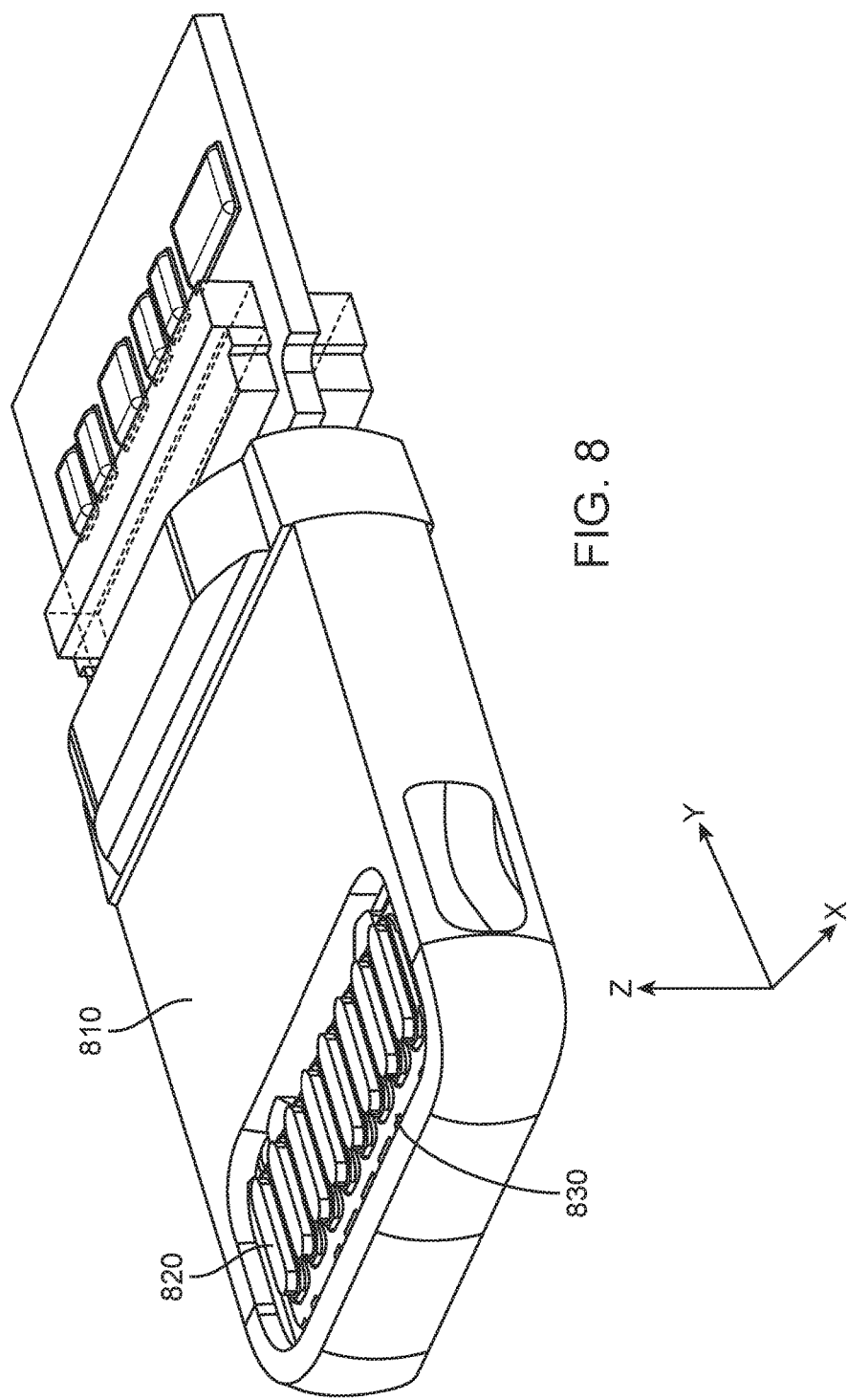
FIG. 8 illustrates a connector insert that may be improved by the incorporation of an embodiment of the present invention.

FIG. 8 illustrates a connector insert that may be improved by the incorporation of an embodiment of the present invention. In this example, a connector insert may include a ground ring 810 surrounding an opening 830 for contacts 820. Contacts 820 may have a length along a major axis in the Y direction that is longer than a length along a minor axis in the X direction. Typically, opening 830 may be filled with an overmold such that only surfaces of contacts 820 are exposed. While contacts 820 are shown here as being located in a connector insert, in other embodiments of the present invention, contacts 820, and the other contacts shown herein and those consistent with embodiments of the present invention may be located at a surface of a device enclosure, in a connector receptacle, or in another type of contacting structure.

Figure 9:
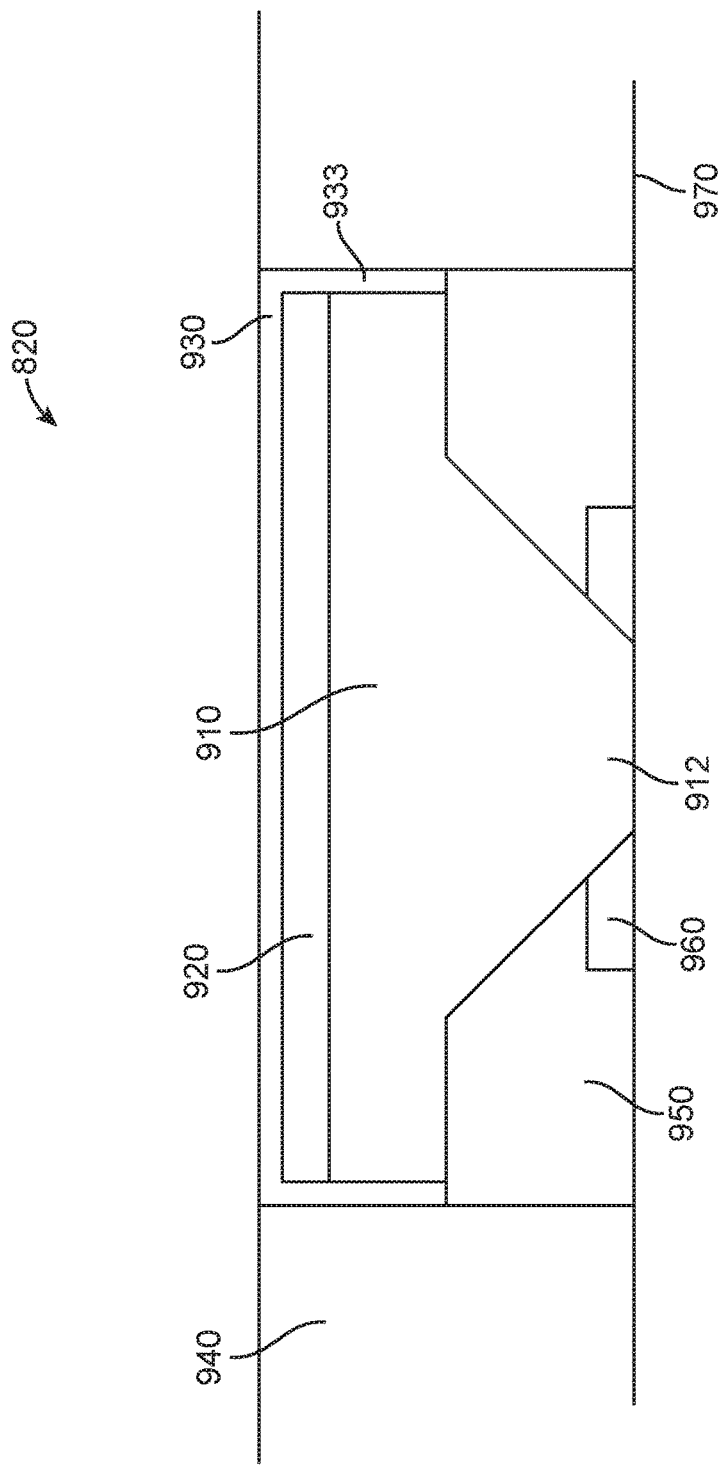
FIG. 9 illustrates a side view of a contact according to an embodiment of the present invention.

FIG. 9 illustrates a side view of a contact according to an embodiment of the present invention. Contact 820 may include a bulk or substrate layer 910. Bulk or substrate layer 910 may terminate in a narrow portion 912. Narrow portion 912 may be electrically connected through solder 960 to a contact on board 970, which may be a flexible circuit board, printed circuit board, or other appropriate substrate. Areas 950 below portions of bulk or substrate layer 910 may include air gaps to reduce side-to-side capacitance between contacts 820. Board 970 may connect to conductors or electrical or mechanical, components in the connector insert housing contact 820. In this way, power and signals may be transferred between a first electronic device and a second electronic device via contacts 820.

Bulk or substrate layer 910 may be clad by precious-metal-alloy layer 920. Precious-metal-alloy layer 920 may be plated by plating layer 930. Plating layer 30 may extend along sides of the contact shown as regions 933. Regions 933 may be omitted or may extend along other portions of the underside of contact 820. Contact 820 may be located in an overmold region 940 in opening 830 in ground ring 810 as shown in FIG. 8.

The resources consumed by contact 820 may be reduced by forming the bulk or substrate layer 910 using a readily available material, such as copper or a material that is primarily copper based, such as phosphor bronze. In these and other embodiments of the present invention, the bulk or substrate layer 910 may be formed using copper-nickel-tin, copper-nickel-silver alloy, steel, or other appropriate material or alloy. Material having good electrical conductivity and a good availability may be selected for use to form bulk or substrate layer 910. The material may also be selected to have a good formability and elongation and hardness similar to that of the material used for the precious-metal-alloy layer 920. In various embodiments of the present invention, the bulk or substrate layer 910 may have a Vickers hardness of below 100, between 100-200, between 200-300, over 300, or a hardness in another range. In these and other embodiments of the present invention, the bulk or substrate layer 910 may form the majority of the contact and may have a thickness less than 1 mm, more than 1 mm, from 0.5 to 1.5 mm, approximately 1.0 mm, between 1 mm and 10 mm, more than 10 mm, or it may have a thickness in a different range of thicknesses.

Bulk or substrate layer 910 may be may be clad by a precious-metal-alloy layer 920. Precious-metal-alloy layer 920 may be a high entropy material, such as materials consistent with ASTM Standards B540, B563, B589, B683, B685, or B731, yellow gold, or other materials. The material for the precious-metal-alloy layer 920 may be selected to have a good hardness and strength, as well as a high conductivity or low electrical resistance. A material having a good formability and high elongation for improved manufacturability may be selected for use as the precious-metal alloy. In various embodiments of the present invention, the precious-metal-alloy layer 920 may have a Vickers hardness below 100, between 100-200, between 200-300, over 300, or a hardness in another range. In these and other embodiments of the present invention, the precious-metal-alloy layer 920 may have a thickness less than 10 micrometers, more than 10 micrometers, from 10 micrometers to 100 micrometers, from 10 micrometers to hundreds of micrometers, more than 100 micrometers, from 100 micrometers to hundreds of micrometers, or it may have a thickness in a different range of thicknesses.

In these and other embodiments of the present invention, one or more intermediate layers may be placed between precious-metal-alloy layer 920 and the bulk or substrate layer 910. These intermediate layers may have better corrosion resistance than copper and may also be more readily available than the material used as the precious-metal alloy. The one or more intermediate layers may be formed using titanium, steel, tantalum, or other material. This material may be selected based on its availability, formability, elongation, hardness, conductivity, ability to be stamped, or other property.

Cladding or precious-metal-alloy layer 920 may be plated by one or more plating layers, shown here as plating stack 930. Plating stack 930 may be used to provide a color match, or desired color mismatch, with ground ring 810 as shown in FIG. 8. Plating stack 930 may also be used to provide a hard, scratch resistant surface for contact 820. An example of such a plating stack is shown in the following figure.

Figure 10:
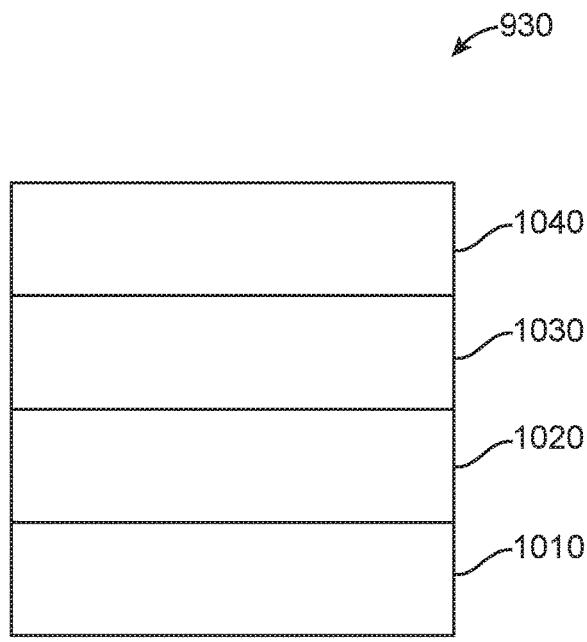
FIG. 10 illustrates a plating stack that may be used to plate a contacting surface of a contact according to embodiments of the present invention.

FIG. 10 illustrates a plating stack that may be used to plate a contacting surface of a contact according to embodiments of the present invention. This plating stack 930 may include a first plating layer 1010 that may be plated over the precious-metal-alloy layer 920 as shown in FIG. 9 for leveling and adhesion. For example, gold may tend to fill vertical differences across a surface of the precious-metal-alloy layer 920. These vertical differences may include nodes and nodules that may be left behind by electropolishing and chemical polishing performed on the underlying material. First plating layer 1010 may also provide adhesion between the precious-metal-alloy layer 920 and a second plating layer 1020. Instead of gold, the first plating layer 1010 may be formed of nickel, copper, tin, tin copper, hard gold, gold cobalt, or other material. This first plating layer 1010 may have a thickness less than 0.01 micrometers, between 0.01 and 0.05 micrometers, between 0.05 and 0.1 micrometers, between 0.05 and 0.15 micrometers, more than 0.1 micrometers, or it may have a thickness in a different range of thicknesses.

In these and other embodiments of the present invention, a second plating layer 1020 may be plated over first plating layer 1010. Second plating layer 1020 may act as a barrier layer to prevent color leakage from the precious-metal-alloy layer 920 to the surface of the contact, and the material used may be chosen on that basis. In these and other embodiments of the present invention, the second plating layer 1020 may be formed using nickel, palladium, tin-copper, silver, or other appropriate material. The use of palladium or other material may provide a second plating layer 1020 that is more positively charged than a top plate 1040 of rhodium ruthenium, rhodium, or other material. This may cause the top plate 1040 to act as a sacrificial layer, thereby protecting the underlying palladium in second plating layer 1020. This second plating layer 1020 may be somewhat harder than a third plating layer 1030 above it, which may prevent layers above the third plating layer 1030 from cracking when exposed to pressure during a connection. This second plating layer 1020 may have a thickness less than 0.1 micrometers, between 0.1 and 0.5 micrometers, between 0.5 and 1.0 micrometers, between 1.0 and 1.5 micrometers, more than 1.0 micrometers, or it may have a thickness in a different range of thicknesses.

In these and other embodiments of the present invention, first plating layer 1010 may be omitted and second plating layer 1020 may be plated directly on precious-metal-alloy layer 920.

In these and other embodiments of the present invention, a third plating layer 1030 may be plated over second plating layer 1020. Third plating layer 1030 may, like first plating layer 1010, may provide leveling and adhesion. For example, gold may tend to fill vertical differences across a surface of the second plating layer, the barrier layer, and may provide adhesion between second plating layer 1020 and a top plate 1040. Instead of gold, third plating layer 1030 may be formed of nickel, copper, tin, tin copper, hard gold, gold cobalt, or other material. This third plating layer 1030 may have a thickness less than 0.01 micrometers, between 0.01 and 0.05 micrometers, between 0.05 and 0.1 micrometers, between 0.05 and 0.15 micrometers, more than 0.1 micrometers, or it may have a thickness in a different range of thicknesses.

In these and other embodiments of the present invention, top plate 1040 may be plated over third plating layer 1030. Top plate 1040 may provide a durable contacting surface for when contact 820 on the electronic device housing the contact is mated with a corresponding contact on a second electronic device. Top plate 1040 may be formed using rhodium ruthenium, dark rhodium, dark ruthenium, gold copper, or other alternatives. This material may be chosen for its color, wear, hardness, conductivity, scratch resistance, or other property. The use of rhodium ruthenium or rhodium may help oxygen formation, which may reduce the corrosion of top plate 540. The percentage of rhodium may be between 85 to 100 percent by weight, for example, it may be 95 or 99 percent by weight, where the most or all of the remaining material is ruthenium. In various embodiments of the present invention, top plate 1040 may have a Vickers hardness below 100, between 100-200, between 200-300, over 300, or a hardness in another range. Top plate 1040 may have a thickness less than 0.5 micrometers, between 0.5 and 0.75 micrometers, between 0.75 and 0.85 micrometers, between 0.85 and 1.1 micrometers, more than 1.1 micrometers, or it may have a thickness in a different range of thicknesses.

In these and other embodiments of the present invention, third plating layer 1030 may be omitted and top plate 1040 may be plated directly on second plating layer 1020.

In these and other embodiments of the present invention, top plate 1040 may be plated directly over first plating layer 1010 and either or both plating layers 1020 and 1030 may be omitted.

In these and other embodiments of the present invention, the plating materials used may be selected based on availability, formability, elongation, hardness, conductivity, ability to be stamped, or other property.

These and the other contacts shown herein and consistent with embodiments of the present invention may be formed in various ways. An example is shown in the following figure.

Figure 11:
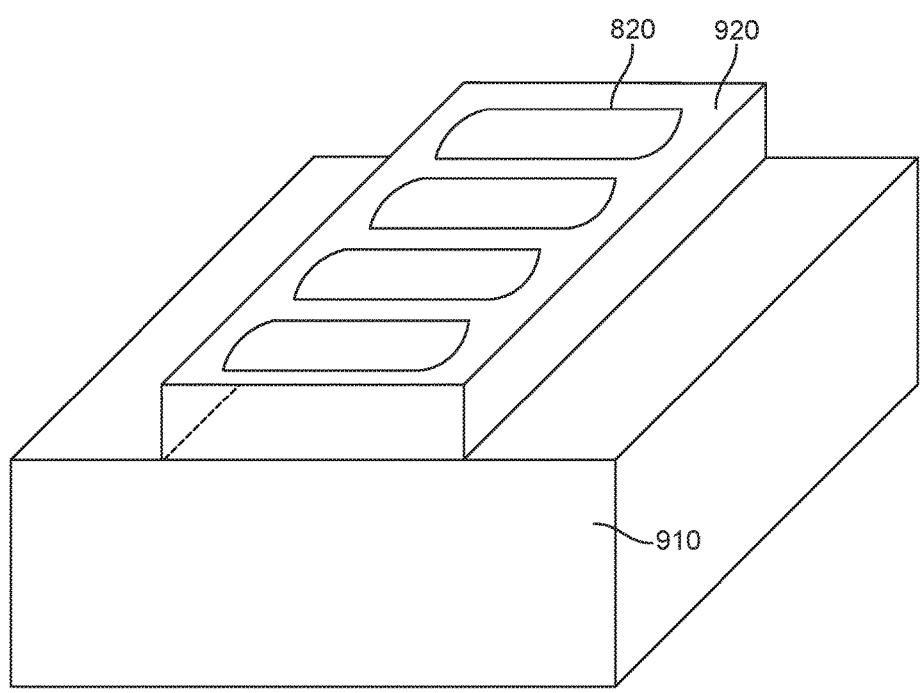
FIG. 11 illustrates a method of manufacturing contacts according to an embodiment of the present invention.

FIG. 11 illustrates a method of manufacturing contacts according to an embodiment of the present invention. This and similar methods may be used to manufacture the above and other contacts shown herein, as well as other contacts according to embodiments of the present invention.

In this example, bulk or substrate layer 910 may be at least partially covered by a precious-metal-alloy layer 920. These layers may be provided on a roll, as shown as roll 610 in FIG. 6. Contacts 820 may be stamped, coined, or otherwise formed in these layers. Carriers (not shown) may be stamped at the same time and used to handle contacts 820 during further processing steps.

In other embodiments of the present invention, precious-metal-alloy layer 920 may be embedded in bulk or substrate layer 910. An example is shown in the following figure.

Figure 12:
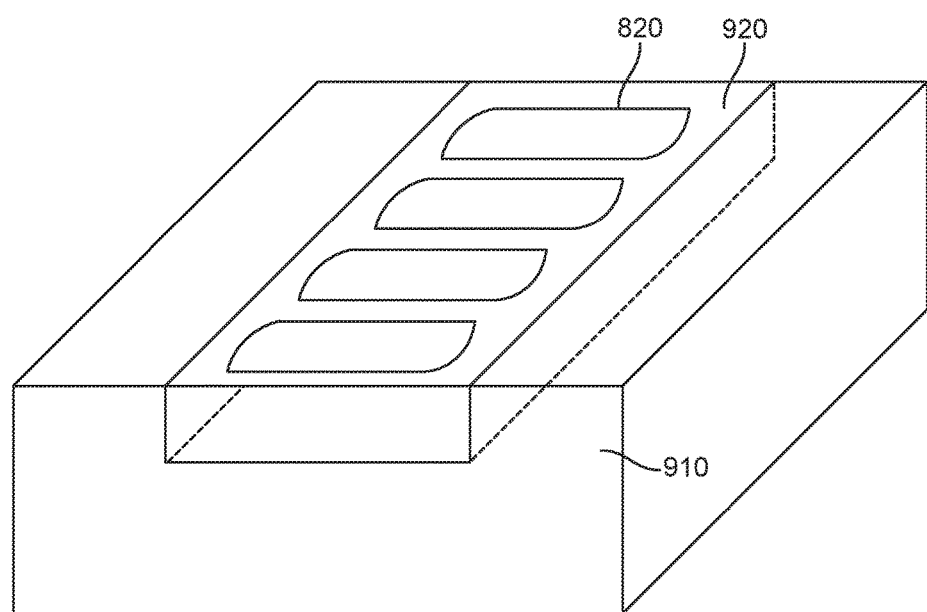
FIG. 12 illustrates a method of manufacturing contacts according to an embodiment of the present invention.

FIG. 12 illustrates a method of manufacturing contacts according to an embodiment of the present invention. In this example, a groove has been skived, cut, etched, or otherwise formed in a surface of bulk or substrate layer 910. A precious-metal-alloy layer 920 has been placed or formed in this groove. As before, contacts 820 may be stamped or coined. Carriers (not shown) may be stamped at the same time and used to handle contacts 820 during further processing steps.

Figure 13:
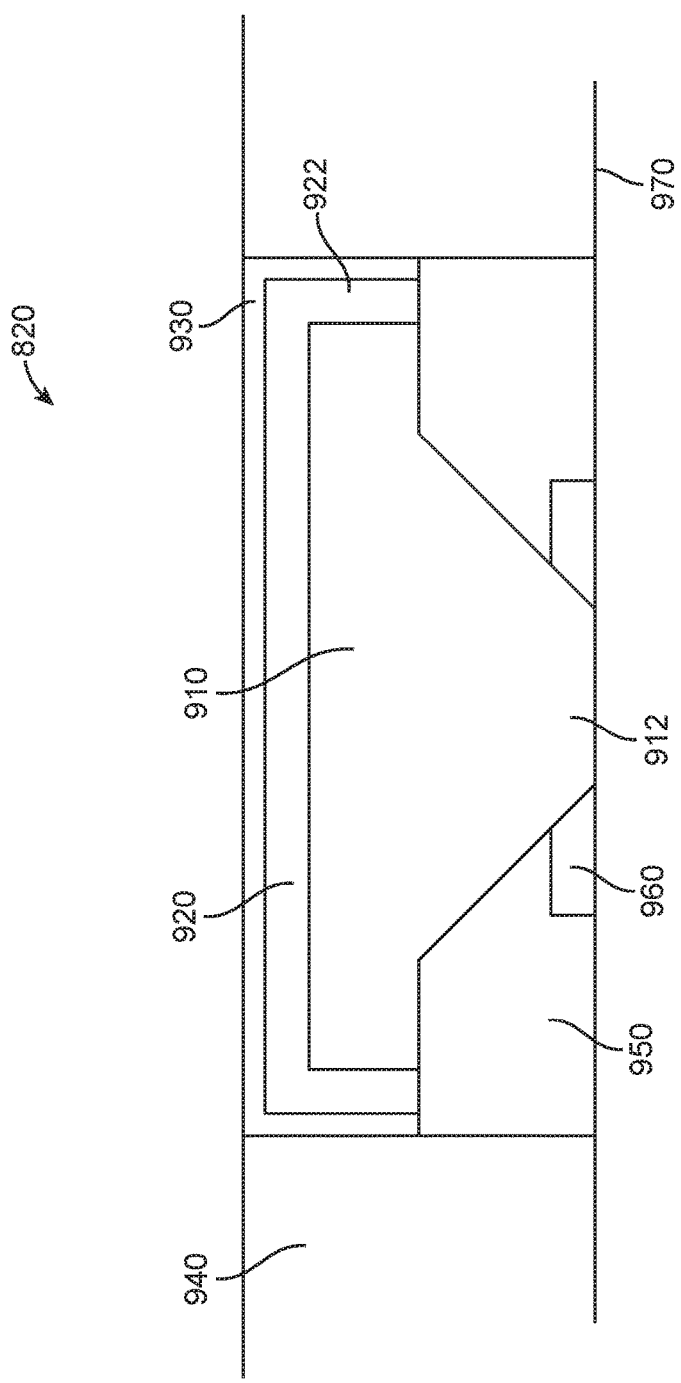
FIG. 13 illustrates another contact according to an embodiment of the present invention.

FIG. 13 illustrates another contact according to an embodiment of the present invention. In this example, some or all of the layers and structures may be identical to the contact shown in FIG. 9. Precious-metal-alloy layer 920 may extend along sides of bulk or substrate layer 910. This may further help to reduce corrosion. Specifically, if moisture or liquid seeps between 940 and contact 820, sides of bulk or substrate layer 910 may be exposed to corrosion. This corrosion may be reduced by the presence of side portions 922 of precious-metal-alloy layer 920. Side portions 922 may be formed at tips or ends of contacts 820, for example, at ends of the major axis of contacts 820. In other examples, the side portions 922 of precious-metal-alloy layer 920 may be around all or portions of sides of bulk or substrate layer 910.

Side portions 922 of precious-metal-alloy layer 920 may be formed in various ways. Examples are shown in the following figures.

Figure 14:
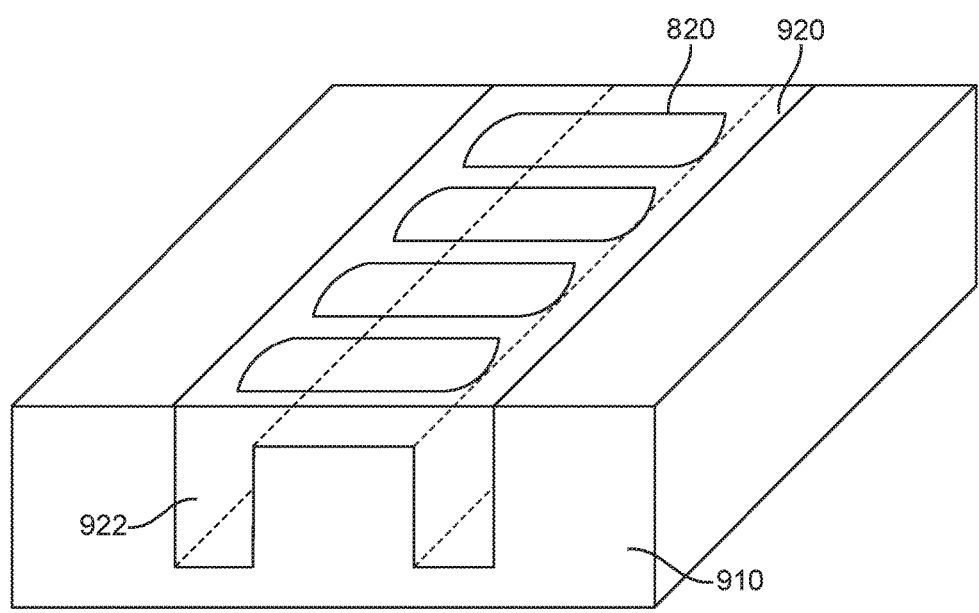
FIG. 14 illustrates a method of manufacturing contacts according to an embodiment of the present invention.

FIG. 14 illustrates a method of manufacturing contacts according to an embodiment of the present invention. In this example, one or more grooves have been formed in bulk or substrate layer 910. That is, one or more grooves have been skived, cut, etched, or otherwise formed in a surface of bulk or substrate layer 910. These one or more grooves have been filled in with precious-metal-alloy layer 920. Two grooves have a greater depth may be used to form side regions 922. Contacts 820 and carriers may be stamped or coined as described herein.

The one or more grooves in bulk or substrate layer 910 may be formed in various ways. Examples are shown in the following figures.

Figure 15:
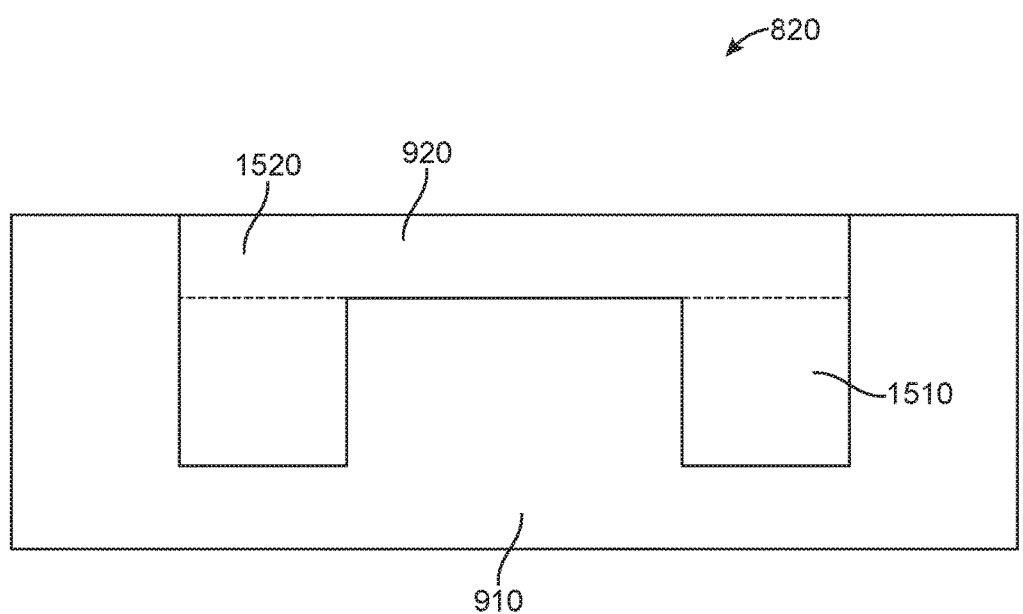
FIG. 15 illustrates a method of forming layers for contacts according to an embodiment of the present invention.

FIG. 15 illustrates a method of forming layers for contacts according to an embodiment of the present invention. In this example, groove 1520 may be formed in bulk or substrate layer 910. This groove may be formed by skiving, cutting, etching, or other appropriate method. Deeper grooves 1510 may then be formed in bulk or substrate layer 910 by skiving, cutting, etching, or other process step. The resulting grooves may be filled with precious-metal-alloy layer 920.

Figure 16:
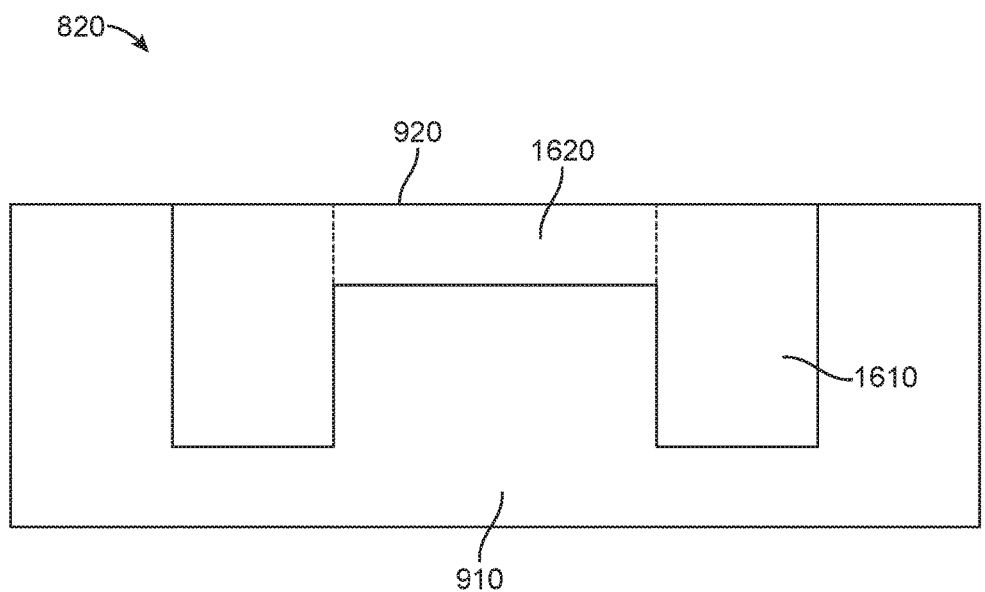
FIG. 16 illustrates another method of forming layers for contacts according to an embodiment of the present invention.

FIG. 16 illustrates another method of forming layers for contacts according to an embodiment of the present invention. In this example, grooves 1610 may be initially formed by skiving, cutting, etching, or other process in bulk or substrate layer 910. Groove 1620 may then be formed, again by skiving, cutting, edging, or other process step. Cladding or precious-metal-alloy layer 920 may then be used to fill the opening formed by grooves 1610 and 1620.

Figure 17:
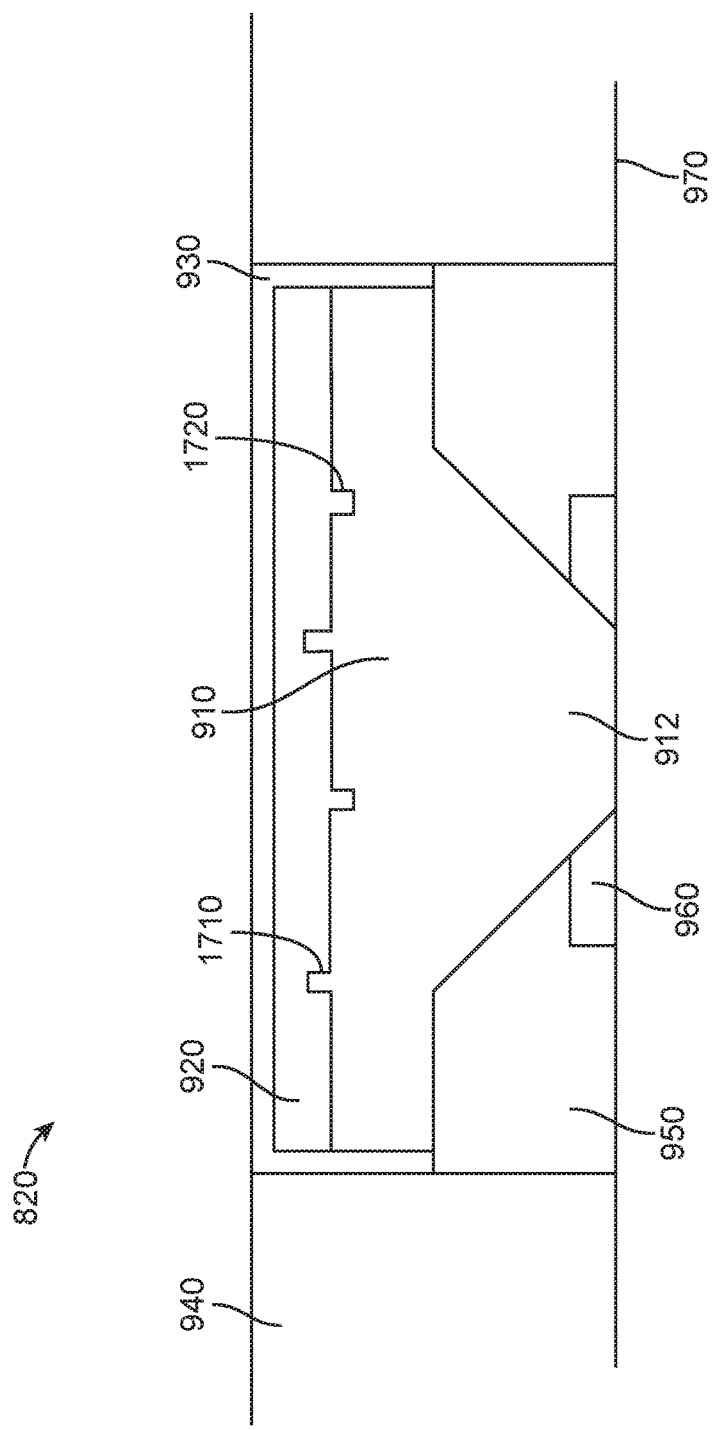
FIG. 17 illustrates another contact according to an embodiment of the present invention.

FIG. 17 illustrates another contact according to an embodiment of the present invention. In this example, some or all of the layers and structures may be identical or similar to the contact shown in FIG. 9. In this example, either or both bulk or substrate layer 910 and precious-metal-alloy layer 920 may include tabs and notches 1710 and 1720. These tabs and notches 1710 and 1720 may be used to secure bulk or substrate layer 910 to precious-metal-alloy layer 920, for example in conjunction with laser welding. In various embodiments of the present invention, either of these tabs may be long enough to pass through the adjacent layer and be riveted or laser welded on the other side to secure bulk or substrate layer 910 to precious-metal-alloy layer 920.

In these and other embodiments of the present invention, contacts may be formed in other ways and have different plating layers. For example, strips of a copper alloy or other material may be butt-welded or otherwise fixed or attached to sides of a strip of a precious-metal alloy to form a strip or roll of material for stamping. Contacts may be stamped such that all of the contact is formed of the precious-metal alloy while a carrier is formed of the copper alloy or other material. Contacts may also be stamped such that only portions, such as a contacting portion, may be formed of the precious-metal alloy while the remainder of the contact and a carrier is formed of the copper alloy or other material in order to conserve resources. Examples are shown in the following figures.

Figure 18:
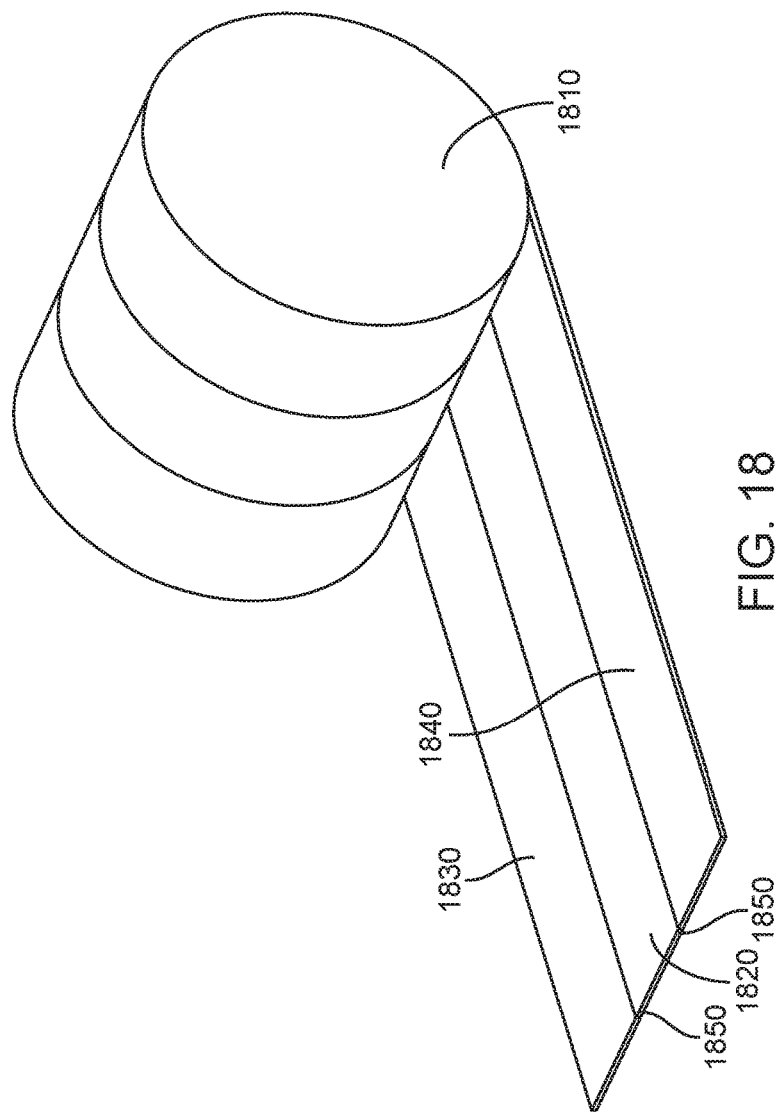
FIG. 18 illustrates a roll of material that may be stamped to form contacts according to an embodiment of the present invention.

FIG. 18 illustrates a roll of material that may be stamped to form contacts according to an embodiment of the present invention. A strip of precious-metal alloy 1820 may be butt-welded or otherwise fixed or attached to edges 1850 of copper alloy strips 1830 and 1840. These strips may be rolled into roll 1810 for handling and manufacturing purposes. In various embodiments of the present invention, contacts may be stamped such that all, or portions of, contacts are formed of precious-metal alloy 1820. In these and other embodiments of the present invention, carriers, which may be used to handle the contacts during manufacturing, may be formed in the copper alloy strips 1830 and 1840. In various embodiments of the present invention, the comparative width of these strips may vary. Also, the materials used may vary. For example, precious-metal alloy 1820 may be replaced with another material. Copper alloy strips 1830 and 1840 may instead be formed of copper, steel, or other material. Examples showing how contacts may be stamped to be fully or partially formed of precious-metal alloy 1820 are shown in the following figures.

Figure 19:
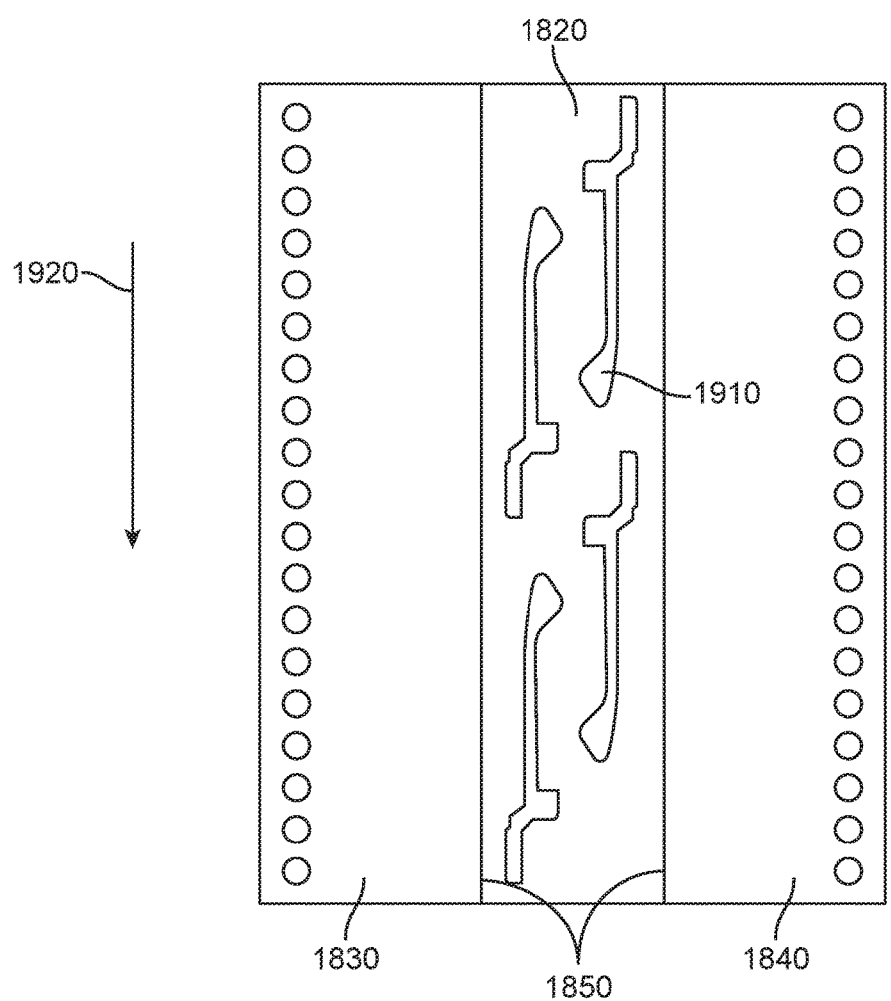
FIG. 19 illustrates a pattern that may be employed in stamping contacts according to an embodiment of the present invention.

FIG. 19 illustrates a pattern that may be employed in stamping contacts according to an embodiment of the present invention. As before, a strip of precious-metal alloy 1820 may be butt-welded at edges 1850 to copper alloy strips 1830 and 1840. In this example, contacts 1910 may be stamped such that they are fully formed of precious-metal alloy 1820. Carriers (not shown), may be formed in the copper alloy strips 1830 and 1840. With the contacts 1910 in this longitudinal direction, the usage of the precious-metal alloy 1820 is good. Also, the grain direction is such that the durability of the resulting contacts may be good. In this embodiment the present invention, a feed direction into a stamping machine may be indicated by arrow 1920.

Figure 20:
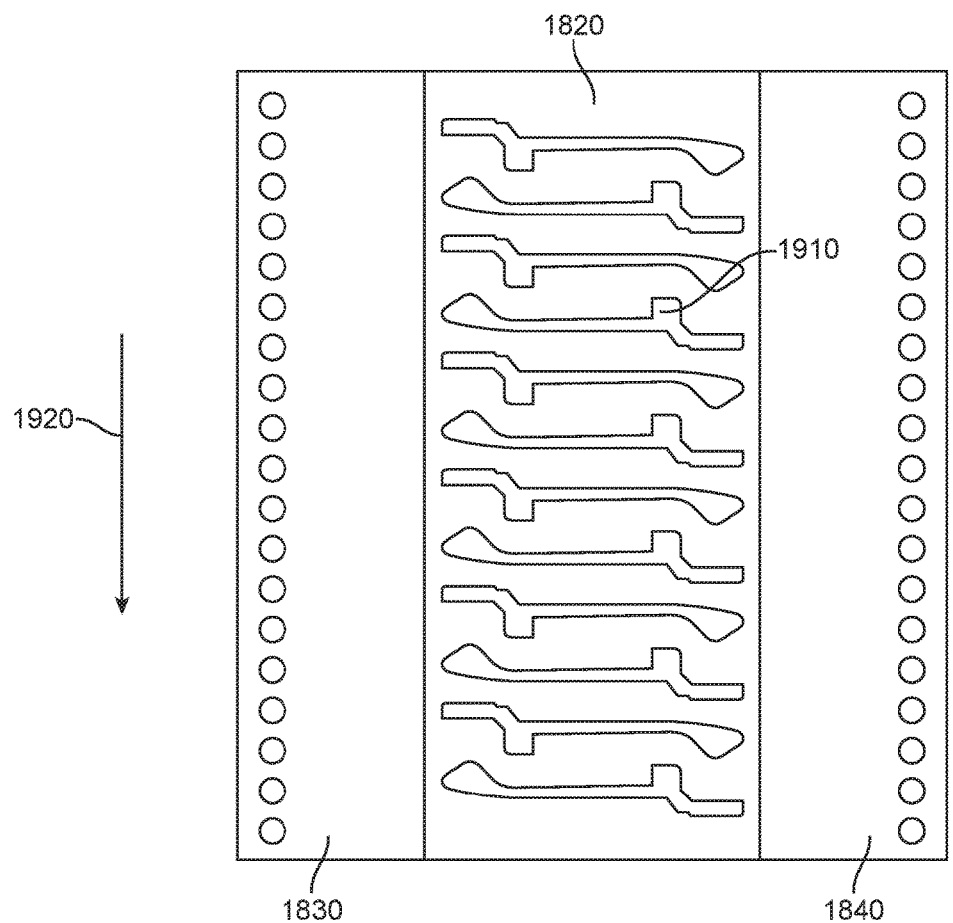
FIG. 20 illustrates another pattern that may be employed in stamping contacts according to an embodiment of the present invention.

FIG. 20 illustrates another pattern that may be employed in stamping contacts according to an embodiment of the present invention. As before, a strip of precious-metal alloy 1820 may be butt-welded at edges 1850 to copper alloy strips 1830 and 1840. Contacts 1910 may be stamped such that they are fully formed of precious-metal alloy 1820. Carriers (not shown) may be formed in copper alloy strips 1830 and 1840. With contacts 1910 in this transverse direction, material utilization may be improved over the example of FIG. 19, though the grain direction may not be as optimal. As before, a feed direction into a stamping machine may be indicated by arrow 1920.

Figure 21:
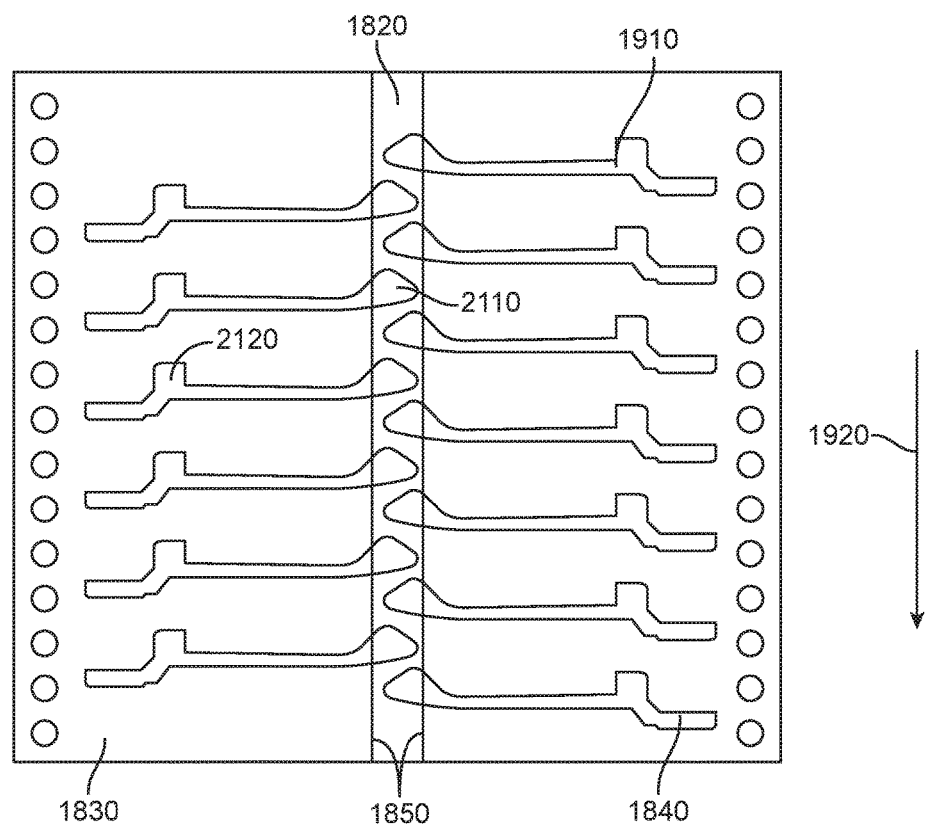
FIG. 21 illustrates another pattern that may be employed in stamping contacts according to an embodiment of the present invention.

FIG. 21 illustrates another pattern that may be employed in stamping contacts according to an embodiment of the present invention. As before, a strip of precious-metal alloy 1820 may be butt-welded at edges 1850 to copper alloy strips 1830 and 1840. In this example, a contacting portion 2110 of contacts 1910 may be formed of precious-metal alloy 1820, while a remainder 2120 of contacts 1910 may be formed in the copper alloy strips 1830 and 1840. As before, a feed direction into a stamping machine may be indicated by arrow 1920.

In these and other embodiments of the present invention, precious-metal-alloy layers or contact portions, such as precious-metal-alloy strip 1820, may be a high entropy material, such as materials consistent with ASTM Standards B540, B563, B589, B683, B685, or B731, yellow gold, or other materials. The material for the precious-metal-alloy layer 1820 may be selected to have a good hardness and strength, as well as a high conductivity or low electrical resistance. A material having a good formability or high elongation for improved manufacturability may be selected for use as the precious-metal alloy 1820. In various embodiments of the present invention, the precious-metal-alloy layer 1820 may have a Vickers hardness below 100, between 100-200, between 200-300, over 300, or a hardness in another range.

These and other embodiments of the present invention may include various plating layers at a contacting or other portion of a contact. Examples are shown in the following figure.

Figure 22:
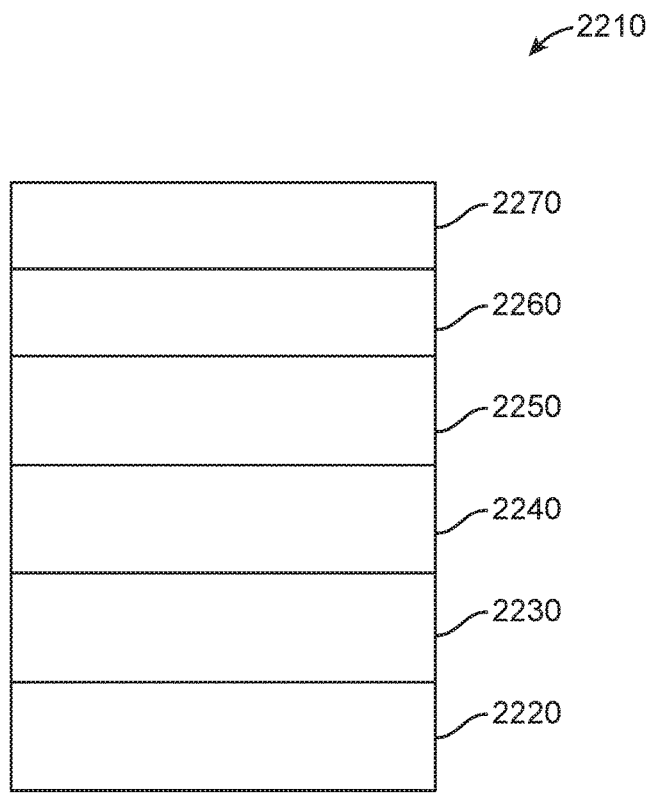
FIG. 22 illustrates contact plating layers according to an embodiment of the present invention.

FIG. 22 illustrates plating layers according to an embodiment of the present invention. In this example, contacts such as the contacts shown in the various examples herein may be plated with plating stack 2210. Also, other types of contacts, for example contacts formed by stamping or other process, and formed of copper, copper alloy, or other material, may be plated with this plating stack 2210. After stamping or other manufacturing step, an electropolish step may be used to removing stamping burrs from the substrate, which could otherwise expose nickel silicides or other particles in the substrate. Unfortunately, the electropolish step may leave nodules on the contact surface. Chemical polish may be used in its place, though a chemical polish may leave nodes behind on the contact surface.

Accordingly, a first plating layer 2220 may be plated on the substrate to provide a surface leveling. This first plating layer 2220 may be copper or other material, such as gold, nickel, tin, tin copper, hard gold, or gold cobalt, and it may be plated over the contact substrate to level the surface of the substrate and cover nodules left by electropolishing, or nodes left by chemical polishing, as well as remaining burrs or other defects from the stamping process. In these other embodiments of the present invention, the first plating layer 2220 may be sufficient and an electropolish step may be omitted. The first plating layer 2220 may also provide adhesion between the substrate and a second plating layer 2230 that may be plated over the first plating layer 2220. The first plating layer 2220 may have a thickness of 0.5 to 1.0 micrometers, 1.0 to 3.0 micrometers, 3.0 to 4.5 micrometers, 3.0 to 5.0 micrometers, or more than 5.0 micrometers, or it may have a thickness in a different range of thicknesses. In other embodiments of the present invention, this first layer 2220 may be omitted.

Cracks in these plating layers may provide pathways for fluids that may cause corrosion. Accordingly, a second, harder plating layer 2230 to prevent layers above it from cracking may be plated over the first plating layer 2220. This second plating layer 2230 may be formed of an electroless nickel composite. This second plating layer may be formed of a nickel-tungsten alloy. This second plating layer 2230 may have a thickness of 0.5 to 1.0 micrometers, 1.0 to 2.0 micrometers, 2.0 to 5.0 micrometers, or more than 5.0 micrometers, or it may have a thickness in a different range of thicknesses. In other embodiments of the present invention, this second layer 2230 may be omitted.

A third plating layer 2240 may work in conjunction with the second plating layer 2230. The third plating layer 2240 may be plated over the second plating layer. This third plating layer 2240 may be soft to absorb shock and thereby minimize cracking in the layers above the third plating layer 2240. The third plating layer 2240 may be gold or other material such as copper, nickel, tin, tin copper, hard gold, or gold cobalt. The third plating layer 2240 may provide adhesion between its neighboring layers and may provide a leveling effect as well. This third plating layer 2240 may have a thickness of 0.55 to 0.9 micrometers, 0.5 to 1.25 micrometers, 1.25 to 2.5 micrometers, 2.5 to 5.0 micrometers, or more than 5.0 micrometers, or it may have a thickness in a different range of thicknesses. In various embodiments of the present invention, these second and third plating layers 2230 and 2240 may be omitted, or the second plating layer 2230 may be omitted, though other layers may be added or omitted as well or instead.

A fourth plating layer 2250 to provide corrosion resistance may be plated over third plating layer 2240. The fourth plating layer 2250 layer may act as a barrier layer to prevent color leakage to the surface of the contact, and the material used for the fourth plating layer 2250 may be chosen on this basis. This layer may be formed of palladium or other material such as nickel, tin-copper, or silver. The use of palladium or other material may provide a fourth plating layer 2250 that is more positively charged than a top plate 2270 of rhodium ruthenium, rhodium, or other material. This may cause the top plate 2270 to act as a sacrificial layer, thereby protecting the underlying palladium in fourth plating layer 2250. This fourth plating layer 2250 may be somewhat harder than a fifth plating layer 2260 above it, which may prevent layers above the fourth plating layer 2250 from cracking when exposed to pressure during a connection. The fourth plating layer 2250 may have a thickness of 0.5 to 0.8 micrometers, 0.5 to 1.0 micrometers, 1.0 to 1.5 micrometers, 1.5 to 3.0 micrometers, or more than 3.0 micrometers, or it may have a thickness in a different range of thicknesses. When palladium is used, it may be plated at a rate of 0.6 plus or minus 0.1 ASD or other appropriate rate.

A fifth plating layer 2260 to act as an adhesion layer between the fourth plating layer 2250 and a top plate 2270 may be plated over the fourth plating layer 2250. The fifth plating layer 2260 may be gold or other material such as copper, nickel, tin, tin copper, hard gold, or gold cobalt. The fifth plating layer 2260 layer may also provide further leveling. The fifth plating layer 2260 layer may have a thickness of 0.02 to 0.05 micrometers, 0.05 to 0.15 micrometers, 0.10 to 0.20 micrometers, 0.15 to 0.30 micrometers, or more than 0.30 micrometers, or it may have a thickness in a different range of thicknesses.

A top plate 2270 may be formed over the fifth plating layer 2260. The top plate 2270 may be highly corrosive and wear resistant. This top plate 2270 may be thinned in high-stress locations to reduce the risk of cracking. Top plate 2270 may provide a durable contacting surface for when the contact on the electronic device housing the contact is mated with a corresponding contact on a second electronic device. In various embodiments of the present invention, top plate 2270 may have a Vickers hardness below 100, between 100-200, between 200-300, over 300, or a hardness in another range. Top plate 2270 may be formed using rhodium ruthenium, dark rhodium, dark ruthenium, gold copper, or other alternatives. The use of rhodium ruthenium or rhodium may help oxygen formation, which may reduce its corrosion. The percentage of rhodium may be between 85 to 100 percent by weight, for example, it may be 95 or 99 percent by weight, where the most or all of the remaining material is ruthenium. This material may be chosen for its color, wear, hardness, conductivity, scratch resistance, or other property. The top plate 2270 may have a thickness less than 0.5 micrometers, between 0.5 and 0.75 micrometers, between 0.65 and 1.0 micrometers, 0.75 and 1.0 micrometers, between 1.0 and 1.3 micrometers, more than 1.3 micrometers, or it may have a thickness in a different range of thicknesses.

In various embodiments of the present invention, these layers may be varied. For example, top plate 2270 may be omitted over portions of the contact for various reasons. For example, where a contact has a surface-mount or through-hole contacting portion to be soldered to a corresponding contact on a printed circuit board, top plate 2270 may be omitted from the surface-mount or through-hole contacting portion. In other embodiments of the present invention, other layers, such as the second and third plating layers 2230 and 2240, may be omitted.

Also, in these and other embodiments of the present invention, one or more plating layers may be applied at a varying thickness along a length of the contact. In these embodiments, drum plating may be used. A contact on a carrier may be aligned with a window on a first drum though which physical vapor deposition or other plating step may occur. The window on the first drum may have an aperture that is varied during rotation by a window on a second drum, the second drum inside the first drum. An example is shown in the following figure.

Figure 23:
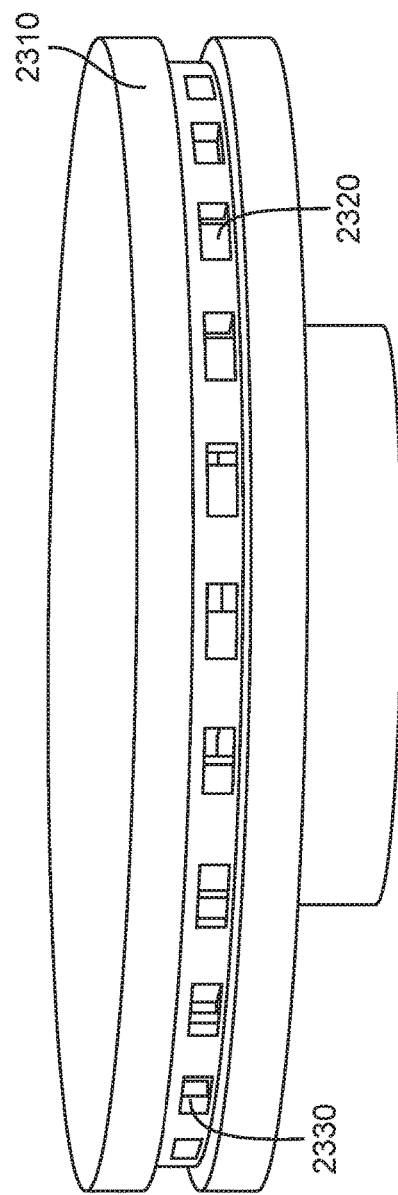
FIG. 23 illustrates a dual-drum that may be used in plating a contact according to an embodiment of the present invention.
Figure 27:
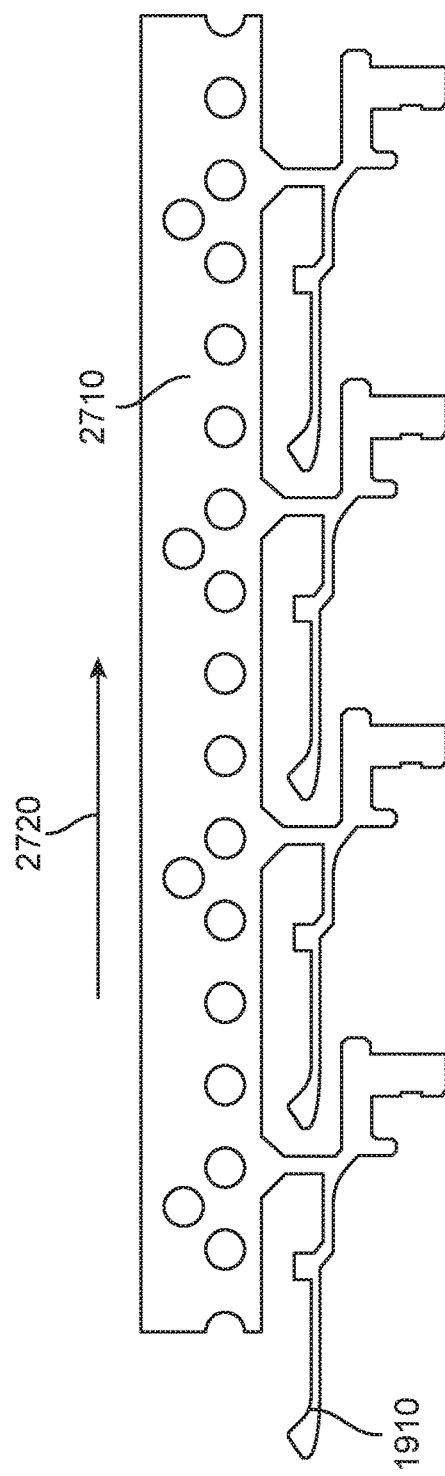
FIG. 27 illustrates a number of contacts and a carrier according to an embodiment of the present invention.

FIG. 23 illustrates a dual-drum that may be used in plating a contact according to an embodiment of the present invention. In this example, an outside drum 2310 may have a number of windows 2320 around an outside edge. Contacts on a carrier (as shown in FIG. 27) may be aligned to each window 2320. The outside drum 2310 may rotate and a plating layer may be formed on the contacts. The aperture of each window 2320 may vary during rotation and may be modulated by windows 2330 on a second inside drum (not shown), where the inside drum turns at a higher rate than the outside drum 2310. The variation in aperture during rotation may cause portions of the contacts that are exposed for longer durations to receive more plating. An example of this variation in aperture is shown in the following figure.

Figure 24:
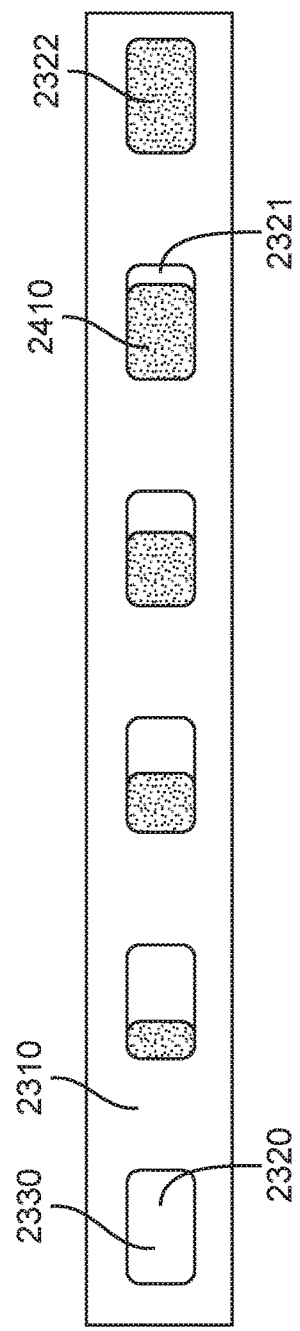
FIG. 24 illustrates an aperture of a plating window of the dual-drum of FIG. 23.

FIG. 24 illustrates an aperture of a plating window of the dual-drum of FIG. 23. A contact on a carrier (as shown in FIG. 27) may be aligned with each window 2320 on outside drum 2310. When a window 2330 on the inside drum is aligned with a window 2320 on the outside drum, the aperture is fully opened and an entire contact (or entire portion of a contact) may be plated. As the inside drum rotates relative to the outside drum 2310, an obstructing portion 2410 between windows 2330 on the inside drum may progressively block window 2320. This narrowing aperture may be indicated as 2321 and 2322 in this figure. An example of a contact that may be plated using this dual-drum apparatus is shown in the following figure.

Figure 25:
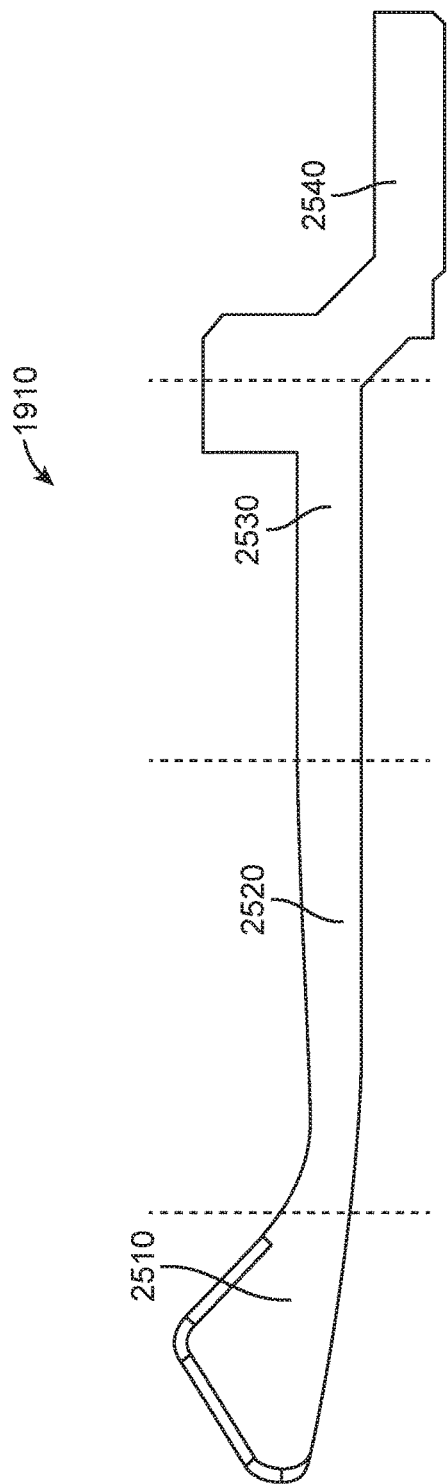
FIG. 25 illustrates a contact that may be plated according to an embodiment of the present invention.

FIG. 25 illustrates a contact that may be plated according to an embodiment of the present invention. Contact 1910 may have a high-wear contacting portion 2510 to mate with a contact in a corresponding connector. Contact 1910 may have a low-stress beam portion 2520, a high-stress beam portion 2530, and a contacting portion 2540, such as a surface-mount or through-hole contacting portion for mating with a corresponding contact on a printed circuit board or other appropriate substrate (not shown). Accordingly, contact 1910 may have a hard layer that is thicker at the high-wear contacting portion 2510 to prevent wear, and thinner at the high-stress beam portion 2530 to avoid cracking, which again may act as a pathway for moisture seepage and thus corrosion.

Contacts, such as contacts 1910, may be located in a connector receptacle, a connector insert, or elsewhere in a connector system.

A substrate for contact 1910 may be stamped, for example from a sheet or strip of copper, or a strip that includes strips of copper welded to sides of a strip of a precious-metal alley, or as shown in any of the examples shown herein. An electropolish or chemical polish step may be used to removing stamping burrs, though they may leave nodules or nodes on the contact surface. Again, this contact 1910 may be plated in various embodiments of the present invention. An example is shown in the following figure.

Figure 26:
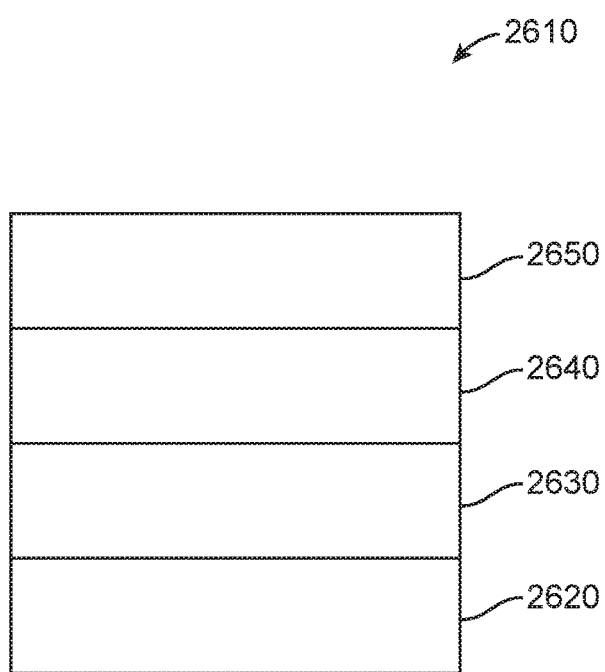
FIG. 26 illustrates plating layers according to an embodiment of the present invention.

FIG. 26 illustrates plating layers according to an embodiment of the present invention. In this example, a plating stack 2610 may include four layers, though in various embodiments of the present invention, there may be less than four or more than four layers. A first plating layer 2620 to provide a surface leveling may be plated on the substrate. This first plating layer 2620 may be copper or other material such as gold, nickel, tin, tin copper, hard gold, or gold cobalt, or other material, and first plating layer 2620 may be plated over the contact substrate to level the surface of the stamped substrate. In these other embodiments of the present invention, first plating layer 2620 may be sufficient and an electropolish step may be omitted. This first plating layer 2620 may also provide adhesion between its neighboring substrate and second plating layer 2630. First plating layer 2620 may have a thickness of 0.5 to 1.0 micrometers, 1.0 to 3.0 micrometers, 3.0 to 5.0 micrometers, or more than 5.0 micrometers, or it may have a thickness in a different range of thicknesses.

A second plating layer 2630 to provide corrosion resistance may be plated over first plating layer 2620. The second plating layer 2630 may act as a barrier layer to prevent color leakage to the surface of the contact, and the material used for the second plating layer 2630 may be chosen on this basis. This second plating layer 2630 may be formed of palladium or other material such as nickel, tin-copper, or silver. The use of palladium or other material may provide a second plating layer 2630 that is more positively charged than a top plate 2650 of rhodium ruthenium, rhodium, or other material. This may cause the top plate to act as a sacrificial layer, thereby protecting the underlying palladium. This layer may be somewhat harder than a third plating layer 2640 above it, which may prevent layers above the second plating layer 2630 from cracking when exposed to pressure during a connection. The second plating layer 2630 may have a thickness that varies along a length of the contact. For example, it may vary from of 0.1 to 0.2 micrometers, 0.2 to 0.3 micrometers, 0.3 to 0.5 micrometers, 0.3 to 1.5 micrometers, 1.0 to 1.5 micrometers or more than 1.5 micrometers, or it may have a thickness in a different range of thicknesses along a length of a contact. The second plating layer 2630 may be thicker near a high-wear contacting portion, and it may thin away from the high-wear region. This may provide a thicker hard layer over contacting portion 2510 for wear resistance and a thinner hard layer over high-stress beam portion 2530 of contact 1910 (as shown in FIG. 25) to avoid cracking.

A third plating layer 2640 to act as an adhesion layer between the second plating layer 2630 and a top plate 2650 may be plated over the second plating layer 2630. The third plating layer 2640 may be gold or other material such as copper, nickel, tin, tin copper, hard gold, or gold cobalt. The third plating layer may also provide a leveling effect. The third plating layer 2640 may have a thickness of 0.02 to 0.05 micrometers, 0.05 to 0.15 micrometers, 0.15 to 0.30 micrometers, or more than 0.30 micrometers, or it may have a thickness in a different range of thicknesses along a length of a contact.

A top plate 2650 may be formed over the third plating layer. The top plate 2650 may be highly corrosive and wear resistant. This top plate 2650 may be thinned in the high-stress beam portion 2930 of contact 1910 (as shown in FIG. 25) to reduce the risk of cracking. The top plate 2650 may be thicker to provide a durable contacting surface for contacting portion 2510 of contact 1910 (as shown in FIG. 25) for when the contact on the electronic device housing the contact is mated with a corresponding contact on a second electronic device. In various embodiments of the present invention, the top plate 2650 may have a Vickers hardness below 100, between 100-200, between 200-300, over 300, or a hardness in another range. The top plate 2650 may be formed using rhodium ruthenium, dark rhodium, dark ruthenium, gold copper, or other alternatives. The use of rhodium ruthenium or rhodium may help oxygen formation, which may reduce its corrosion. The percentage of rhodium may be between 85 to 100 percent by weight, for example, it may be 95 or 99 percent by weight, where the most or all of the remaining material is ruthenium. This material may be chosen for its color, wear, hardness, conductivity, scratch resistance, or other property. Top plate 2650 may have a thickness less than 0.3 micrometers, between 0.3 and 0.55 micrometers, between 0.3 and 1.0 micrometers, between 0.75 and 1.0 micrometers, more than 1.0 micrometers, or it may have a thickness in a different range of thicknesses. Again, top plate 2650 may be omitted from the surface-mount or through-hole contacting portion of contact 1910 (as shown in FIG. 25).

FIG. 27 illustrates a number of contacts and a carrier according to an embodiment of the present invention. In this example, a number of contacts 1910 may be attached to a carrier 2710. A roll direction may be indicated by arrow 2720.

In these and other embodiments of the present invention, other layers may be formed on contacts to prevent wear and corrosion. An example is shown in the following figure.

Figure 28:
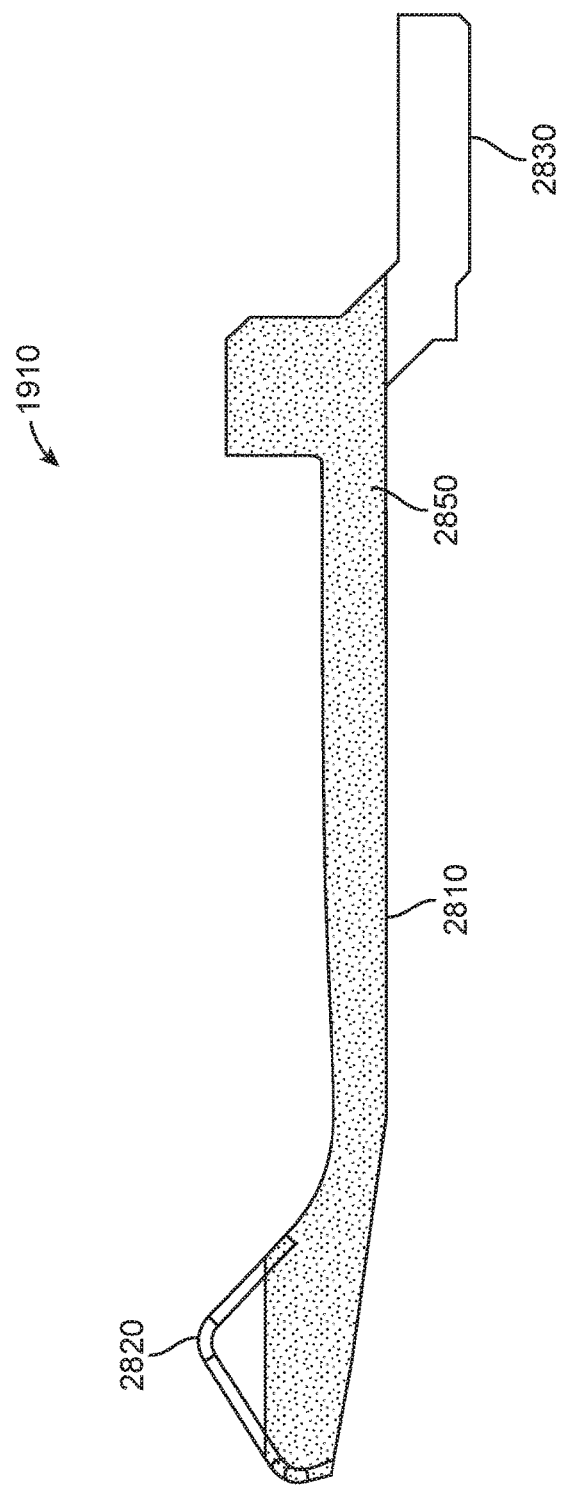
FIG. 28 illustrates a contact partially plated with plastic, resin, or other material according to an embodiment of the present invention.

FIG. 28 illustrates a contact partially plated with plastic, resin, or other material according to an embodiment of the present invention. In this example, a plastic insulating layer or coating 2850 may be formed using electrophoretic deposition (ED) or other appropriate method. This layer or coating 2850 may cover portion of a contact 1910, primarily beam 2810, to prevent corrosion. A contacting portion 2820 of contact 1910 may remain exposed such that it may form an electrical connection with a contact in a corresponding connector. Also, a surface-mount 2830 or through-hole contact portion (not shown) may remain exposed such that it may be soldered to a corresponding contact on a board or other appropriate substrate.

Figure 29:
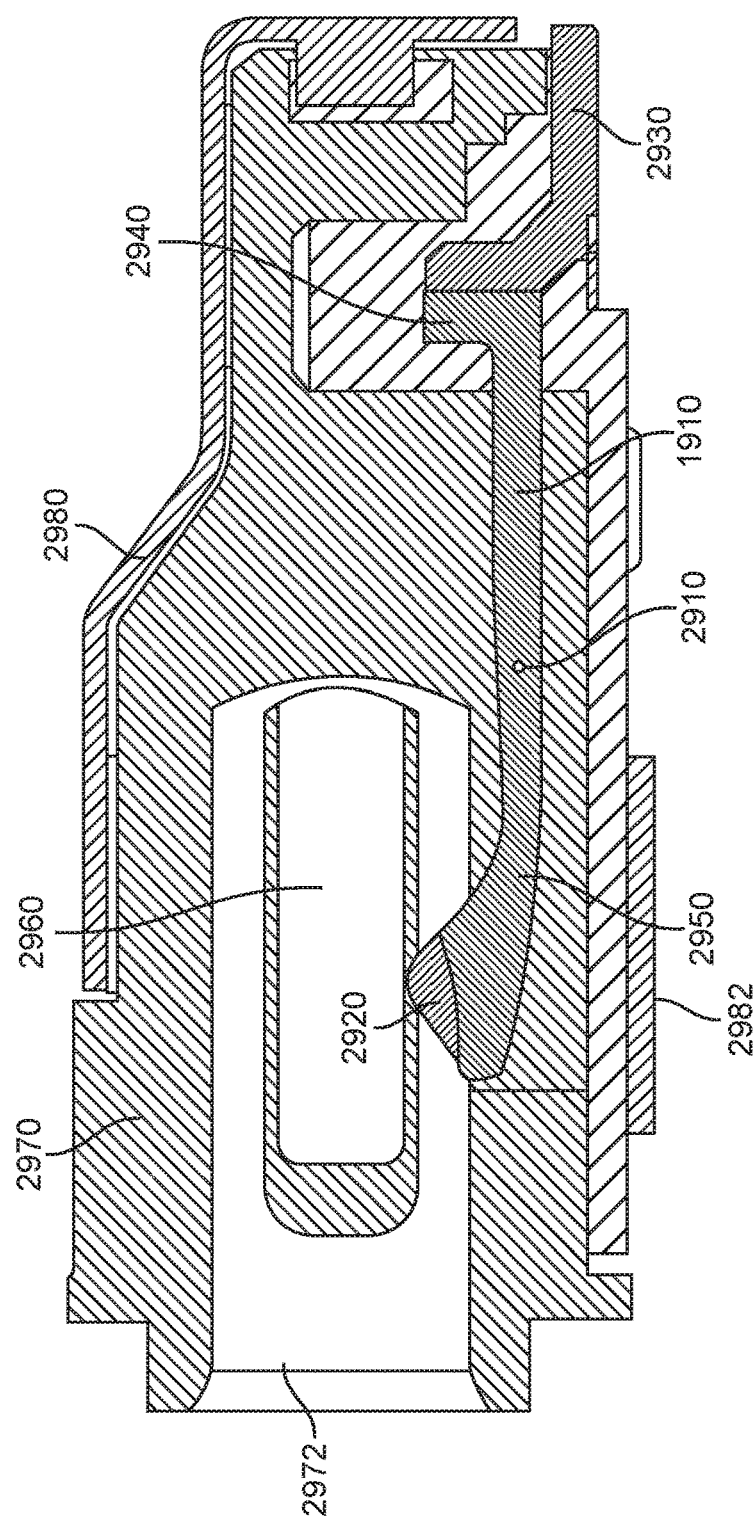
FIG. 29 illustrates a connector receptacle including a contact partially plated with plastic, resin, or other material according to an embodiment of the present invention.

FIG. 29 illustrates a connector receptacle including a contact partially plated with plastic, resin, or other material according to an embodiment of the present invention. This connector may include a number of contacts 1910 supported by a housing 2970. Housing 2970 may include a front opening 2972 for accepting a connector insert (not shown) and may be at least partially surrounded by top shield 2980 and bottom shield 2982. Side ground contact 2960 may contact a shield of the connector insert when the connector insert is inserted into the connector receptacle.

Each contact 1910 may include beam 2910, contacting portion or area 2920, surface-mount contact portion 2830, and mechanical stabilizing portion 2940. Contacting portion or area 2920 may mate with a contact in a corresponding connector insert when the connector insert is inserted into the connector receptacle. Surface-mount contact portion 2830 may be soldered to a flexible or printed circuit board or other appropriate substrate to form an electrical connection to traces and planes in the board. Mechanical stabilizing portion 2940 may be molded or inserted into housing 2970 to fix contact 1910 in place in the connector receptacle.

Beam 2910 may deflect when a connector insert is inserted into the connector receptacle. This deflection may make the beam more susceptible to cracking due to corrosion. This effect may be referred to as stress corrosion cracking. Similarly, the effects of corrosion may be more severe at the beam due to this defection. That is, there may be either more corrosion, or more sensitivity to corrosion, at base of beam 2910 near mechanical stabilizing portion 2940, such that small amounts of corrosion may destroy or damage contact 1910. In some contacts, plating on base of beam 2910 may crack and fatigue, and this may cause corrosion to accelerate.

Accordingly, these and other embodiments of the present invention may use electrophoretic deposition (ED) or other appropriate method to form ED coating 2950 to protect beam portion 2910 from corrosion. This electrophoretic deposition may form a nonconductive coating, though in these and other embodiments of the present invention, the coating may be conductive or partially conductive. In these and other embodiments of the present invention, the electrophoretic deposition process used may be an electrocoating, cathodic or anodic electrodeposition, electroplastic deposition, electro deposition, electrophoretic coating, electrophoretic painting, or other appropriate process.

Contact 1910 may be formed in various ways. For example, contact 1910 may have either or both contacting area 2920 and surface mount contact portion 2930 covered by a masking layer. The masking layer may be wax, paraffin, or other material. This material may be applied mechanically, by printing, such as with an ink jet, roller, pad, or other applicator, or by other method.

Contact 1910 may then be coated with ED coating 2950. In these and other embodiments of the present invention, the coating material may be an acrylic resin, plastic, or other material. The acrylic resin, or other material, may be mixed with either or both ether and alcohol or other volatile solvents. For example, the coating material may be an acrylic resin mixed with volatile solvents, such as alcohol, butanol, ethaline, glycol, mono-butyl, and others. The ether and alcohol may allow the resin to be in liquid form before application. Contact 1910 may be placed in this bath at a high voltage, for example 20-100 volts. The voltage may attract resin ions to contact 1910 and the resin may form ED coating 2950 on contact 1910.

After ED coating 2950 has been applied, the masking layer may be removed. For example, where the masking layer is wax, it may be removed using hot water. This may also help to set the ED coating 2950 on contact 1910.

As shown in FIG. 21 above, in some embodiments of the present invention, a tip of contact 1910 may be formed of a precious-metal alloy. In this example, the contact area 2920 (and 2820 in FIG. 28) may be formed of precious-metal alloy while other materials may be used to form beam 2910, since beam is coated with ED coating 2950. The use of resin or other coating 2950 may allow the use of a mix of materials. For example, a hard, precious-metal alloy or other material may be used for contact areas 2920 without the consequence of having a brittle beam 2910. This may allow the beam 2910 to be formed of a more flexible, less brittle material. Moreover, the gradient coating techniques shown in FIG. 25 above may be employed as well.

Where contacting area 2920 is formed of a precious-metal alloy, it may be desirable to save resources by reducing its size. This may require a more accurate application of the masking layer. Accordingly, in these and other embodiments of the present invention the masking layer may be formed by printing, such as with an ink jet, roller, pad, or other applicator. These and other embodiments of the present invention may provide contacts that are formed using 3-D printing. The precious-metal alloys used may be the same or similar to those in the examples herein and consistent with other embodiments of the present invention.

Contacts, such as contacts 1910 and the other contacts in these examples, may be formed of various materials. For example, the beams and other contact portions may be formed of copper or other materials. The beams and other portions may be plated with various layers, such as those shown in FIGS. 4, 9, 22, and 26.

Contacts, such as contacts 1910, may be formed in various ways in these and other embodiments of the present invention. An example is shown in the following figure.

Figure 30:
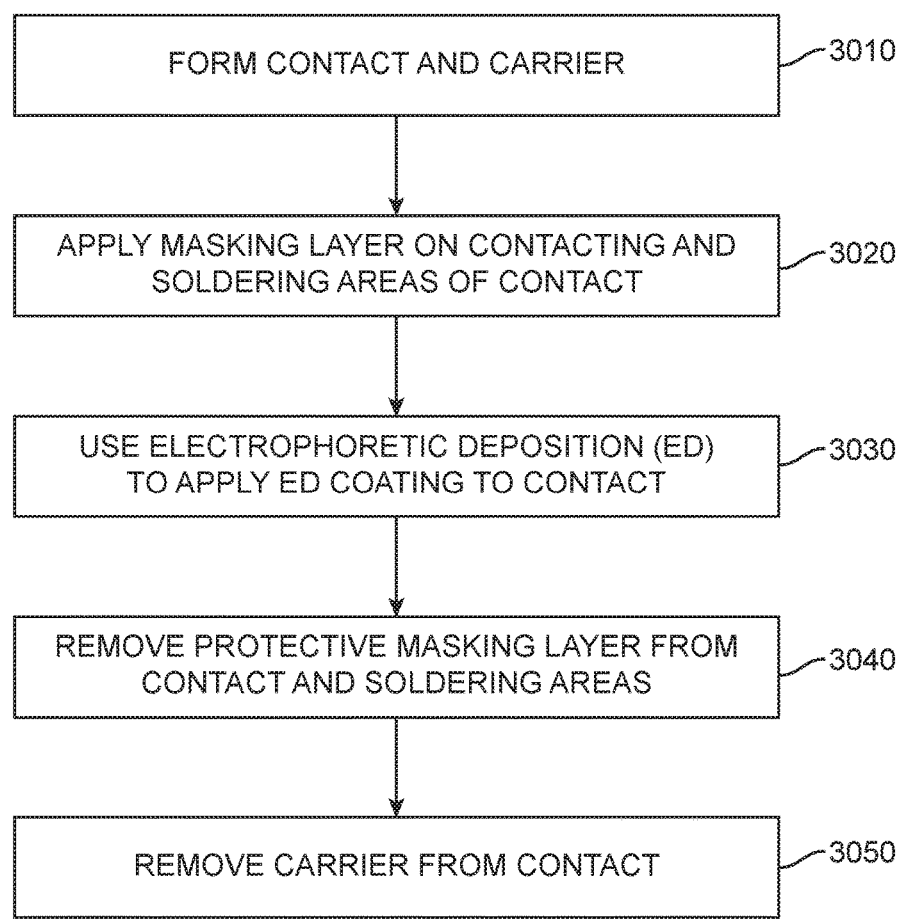
FIG. 30 illustrates a method of manufacturing a contact partially plated with plastic, resin, or other material according to an embodiment of the present invention.

FIG. 30 illustrates a method of manufacturing a contact partially plated with plastic, resin, or other material according to an embodiment of the present invention. In act 3010, a contact, such as contact 1910, and a carrier may be formed. The contact and its carrier may be formed by stamping, forging, molding, metal-injection molding, 3-D printing, or other manufacturing process, for example the process shown in FIG. 21 or any of the other processes shown herein or otherwise consistent with embodiments of the present invention. The contacts may be plated, for example using layers as shown in FIGS. 4, 9, 22, and 26. A masking layer may be applied to a contact area, such as contact area 2920, in act 3020. Other regions, such as surface mount contact portion 2930, may be masked as well. This masking layer may be applied mechanically, by printing, such as with an ink jet, roller, pad, or other applicator, or by other method. The masking layer may be formed of wax, paraffin, or other material.

In act 3030, an electrophoretic coating, such as ED coating 2950, may be applied to the contact using electrophoretic deposition or other appropriate method. In these and other embodiments of the present invention, the electrophoretic deposition process used may be an electrocoating, cathodic or anodic electrodeposition, electroplastic deposition, electro deposition, electrophoretic coating, electrophoretic painting, or other appropriate process. In these and other embodiments of the present invention, the coating material may be an acrylic resin, plastic, or other material. The acrylic resin, or other material, may be mixed with either or both ether and alcohol. For example, the coating material may be an acrylic resin mixed with volatile solvents, such as alcohol, butanol, ethaline, glycol, mono-butyl, and others. The ether and alcohol may allow the coating material to be in liquid form. The contact, such as contact 1910, may be placed in this bath at a high voltage, for example 20-100 volts. The voltage may attract resin ions to contact, and the resin may form the ED coating 2950 on the contact.

After the ED coating has been applied in act 3030, the masking layer may be removed in act 3040. For example, where the masking layer is wax, it may be removed using hot water. This may also help to set the ED coating on the contact. The carrier may be removed in act 3050. The contact, such as contact 1910, may then be inserted in a connector receptacle, such as the connector receptacle shown in FIG. 29 above.

These and other embodiments of the present invention may reduce the rate of corrosion by using various materials as a substrate for contacts in a connector. The substrate materials may be selected from materials which may provide dimensionally stable anodes in corrosive, applied voltage electrochemical operations. A catalytically active material, also stable in the corrosive application, may be coated on top of the substrate, for example by plating. That is, the present invention may use substrate materials that provide dimensionally stable anodes that are combined with contact coating materials to form a contact in a connector that may be stable even in the presence of high voltage and corrosive environments.

These dimensionally stable anode materials may have electrical resistances that may be higher than copper. This may normally make them poor candidates for electrical contacts. However, where dimensions of a contact substrate are small, the increase in absolute resistance may be limited and the improved corrosion properties provide a significant enough benefit to justify the added resistance.

In these and other embodiments of the present invention, titanium, niobium, tantalum, zirconium, tungsten, or other dimensionally stable anode materials may be used for a substrate. These materials may also be used in alloying to modify mechanical properties without negatively impacting the applied voltage electrochemical resistance of the alloy.

In these and other embodiments of the present invention coating materials may include platinum, gold, ruthenium, rhodium, iridium, and palladium. In these and other embodiments of the present invention oxides of these contact coating and substrate materials may be used. Many of the selected materials form stable oxides which also may survive in highly corrosive environments. These may include titanium dioxide, ruthenium oxide, and palladium oxide. In these and other embodiments of the present invention, the contact coating materials may be used as substrate materials. When these materials are used, additional coatings may be used on the surface of the contact.

In a specific embodiment of the present invention, a contact used in a connector may be formed of a niobium substrate. The substrate may be coated by plating with first a platinum layer, followed by a Gold intermediate layer, and then a top contact layer of rhodium/ruthenium alloy.

In these and other embodiments of the present invention, the non-mating portions of the connector may be encapsulated in a sealed and liquid resistant material, such as an epoxy, so that corrosive materials cannot pass beyond the connector into corrosive materials, such as copper, present behind the corrosion resistant connector.

Several contacts, such as contacts 220, 222, 820, and 1910, are shown in particular contexts. In various embodiments of the present invention, these contacts may be used in other contexts. For example, they may be located at a surface of a device enclosure, in a connector insert, on a connector insert, in a connector receptacle, or in, or on, another contacting structure. Also, while these contacts are shown as having a particular shape, these shapes may vary in these and other embodiments of the present invention.

Several methods of forming contacts are shown herein, such as stamping contacts from copper or some combination of copper and a precious-metal alloy. Also, several plating stacks and methods of plating are shown, as are various form factors for contacts. In various embodiments of the present invention, each of these contacts of various form factors may be formed of copper or some combination of copper and a precious-metal alloy, or other materials, and may be plated with one or more of the various stacks shown herein. For example, contacts, such as contacts 220 may be plated using one or more of the plating stacks 430, 930, 2210, 2610, or other plating stacks according to an embodiment of the present invention. Contacts such as contacts 222 may be plated using one or more of the plating stacks 430, 930, 2210, 2610, or other plating stacks according to an embodiment of the present invention. Contacts such as contacts 820 may be plated using one or more of the plating stacks 430, 930, 2210, 2610, or other plating stacks according to an embodiment of the present invention. Contacts such as contacts 1910 may be plated using one or more of the plating stacks 430, 930, 2210, 2610, or other plating stacks according to an embodiment of the present invention. Other contacts may be plated using one or more of the plating stacks 430, 930, 2210, 2610, or other plating stacks according to an embodiment of the present invention.

While embodiments of the present invention are well-suited to contact structures and their method of manufacturing, these and other embodiments of the present invention may be used to improve the corrosion resistance of other structures. For example, electronic device cases and enclosures, connector housings and shielding, battery terminals, magnetic elements, measurement and medical devices, sensors, fasteners, various portions of wearable computing devices such as clips and bands, bearings, gears, chains, tools, or portions of any of these, may be covered with a precious-metal alloy and plating layers as described herein and otherwise provided for by embodiments of the present invention. The precious-metal alloy and plating layers for these structures may be formed or manufactured as described herein and otherwise provided for by embodiments of the present invention. For example, magnets and other structures for fasteners, connectors, speakers, receiver magnets, receiver magnet assemblies, microphones, and other devices may have their corrosion resistance improved by structures and methods such as those shown herein and in other embodiments of the present invention.

In these and other embodiments of the present invention, including the above contacts, other layers, such as barrier layers to prevent corrosion of internal structures may be included. For example, barrier layers, such as zinc barrier layers, may be used to protect magnets or other internal structures from corrosion by cladding or plating layers. Catalyst layers may be used to improve the rate of deposition for other layers, thereby improving the manufacturing process. These catalyst layers may be formed of palladium or other material. Stress separation layers, such as those formed of copper, may also be included in these and other embodiments of the present invention, including the above contacts. Other scratch protection, passivation, and corrosion resistance layers may also be included.

In various embodiments of the present invention, the components of contacts and their connector assemblies may be formed in various ways of various materials. For example, contacts and other conductive portions may be formed by stamping, metal-injection molding, machining, micro-machining, 3-D printing, or other manufacturing process. The conductive portions may be formed of stainless steel, steel, copper, copper titanium, phosphor bronze, palladium, palladium silver, or other material or combination of materials. They may be plated or coated with nickel, gold, or other material. The nonconductive portions, such as the housings and other portions, may be formed using injection or other molding, 3-D printing, machining, or other manufacturing process. The nonconductive portions may be formed of silicon or silicone, Mylar, Mylar tape, rubber, hard rubber, plastic, nylon, elastomers, liquid-crystal polymers (LCPs), ceramics, or other nonconductive material or combination of materials.

Embodiments of the present invention may provide contacts and their connector assemblies that may be located in, and may connect to, various types of devices, such as portable computing devices, tablet computers, desktop computers, laptops, all-in-one computers, wearable computing devices, cell phones, smart phones, media phones, storage devices, keyboards, covers, cases, portable media players, navigation systems, monitors, power supplies, adapters, remote control devices, chargers, and other devices. These contacts and their connector assemblies may provide pathways for signals that are compliant with various standards such as Universal Serial Bus (USB), High-Definition Multimedia Interface (HDMI), Digital Visual Interface (DVI), Ethernet, DisplayPort, Thunderbolt, Lightning, Joint Test Action Group (JTAG), test-access-port (TAP), Directed Automated Random Testing (DART), universal asynchronous receiver/transmitters (UARTs), clock signals, power signals, and other types of standard, non-standard, and proprietary interfaces and combinations thereof that have been developed, are being developed, or will be developed in the future. In various embodiments of the present invention, these interconnect paths provided by these connectors may be used to convey power, ground, signals, test points, and other voltage, current, data, or other information.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. An electronic device comprising:
   a connector receptacle comprising:
   a housing; and
   a plurality of contacts supported by the housing; each contact comprising:
      a beam comprising a first material; and
      a contacting portion welded to the beam and comprising a second material consistent with one of ASTM Standards B540, B563, B589, B683, B685, or B731.

2. The electronic device of claim 1 wherein the second material is consistent with ASTM Standard B540.

3. The electronic device of claim 1 wherein each of the plurality of contacts comprises a surface-mount contact portion, the surface-mount contact portion of each of the plurality of contacts attached to a board of the electronic device.

4. The electronic device of claim 3 further comprising a nonconductive coating partially covering the beam such that at least a portion of the contacting portion is exposed.

5. The electronic device of claim 4 wherein the surface-mount contact portion of each of the plurality of contacts is not covered by the nonconductive coating.

6. The electronic device of claim 5 wherein the beam of each of the plurality of contacts is formed primarily of copper.

7. The electronic device of claim 6 further comprising a plurality of plating layers over the beam, wherein the plurality of plating layers comprises a leveling layer over the beam, a first adhesion layer over the leveling layer, a barrier layer over the first adhesion layer, a second adhesion layer over the barrier layer, and a top plate over the second adhesion layer.

8. The electronic device of claim 7 wherein the first adhesion layer and the second adhesion layer are formed of gold, the barrier layer comprises one of tin-copper, nickel, palladium, or silver, and the top plate comprises one of copper, gold, rhodium-ruthenium, gold-palladium, dark ruthenium, dark palladium, or gold-copper.

9. A connector insert comprising:
a ground ring around an opening;
a plurality of contacts located in the opening;
an overmold formed around the plurality of contacts in the opening such that contacting surfaces of each of the plurality of the contacts are exposed, each of the plurality of contacts comprising:
a substrate having a top surface;
a layer of high-entropy material clad to the top surface of the substrate, wherein the layer of high-entropy material comprises a material consistent with one of ASTM Standards B540, B563, B589, B683, B685, or B731; and
a plurality of plating layers plated over the layer of high-entropy material and including a top plate to form the contacting surface.

10. The connector insert of claim 9 wherein the layer of high-entropy material extends at least partially along sides of each of the plurality of contacts.

11. The connector insert of claim 9 wherein each of the plurality of contacts comprises a narrow portion attached to a printed circuit board.

12. The connector insert of claim 11 wherein the high-entropy material comprises a material consistent with ASTM Standard B540.

13. The connector insert of claim 9 wherein the plurality of plating layers further comprises a first adhesion layer over the layer of high-entropy material, a barrier layer over the first adhesion layer, a second adhesion layer over the barrier layer, and a top plate over the second adhesion layer.

14. The connector insert of claim 13 wherein the top plate comprises one of copper, gold, rhodium-ruthenium, gold-palladium, dark ruthenium, dark palladium, or gold-copper.

15. The connector insert of claim 14 wherein the first adhesion layer and the second adhesion layer are formed of gold and the barrier layer comprises one of tin-copper, nickel, palladium, or silver.

16. An electronic device comprising:
a connector receptacle comprising:
a housing; and
a plurality of contacts supported by the housing; each contact comprising:
a beam having a contacting area near an end of the beam;
a nonconductive electrophoretic coating over the beam such that the contacting area of the beam is exposed; and
a plurality of plating layers over the beam, wherein the plurality of plating layers comprises a leveling layer over the beam, a first adhesion layer over the leveling layer, a barrier layer over the first adhesion layer, a second adhesion layer over the barrier layer, and a top plate over the second adhesion layer, wherein leveling layer comprises one of a nickel-tungsten alloy or nickel alloy, the first adhesion layer and the second adhesion layer are formed of gold, and the barrier layer comprises one of tin-copper, nickel, palladium, silver, nickel-tungsten, or nickel alloy.

17. The electronic device of claim 16 wherein the beam is formed primarily of copper.

18. The electronic device of claim 16 wherein the top plate comprises one of copper, gold, rhodium-ruthenium, gold-palladium, dark ruthenium, dark palladium, or gold-copper.

19. The electronic device of claim 16 wherein each of the plurality of contacts comprises a surface-mount contact portion.

20. The electronic device of claim 19 wherein the surface-mount contact portion is not covered by the nonconductive electrophoretic coating.

* * * * *